US009082240B2

(12) United States Patent
Cara et al.

(10) Patent No.: US 9,082,240 B2
(45) Date of Patent: Jul. 14, 2015

(54) DEVICE FOR DETECTING THE PRESENCE OF A USER BY A VEHICLE

(75) Inventors: Herve Cara, Creteil (FR); Stephane Violleau, Creteil Cedex (FR); Frederic Bocage, Creteil Cedex (FR); Van-Quyn Nguyen, Creteil (FR)

(73) Assignee: VALEO SECURITE HABITACLE, Créteil (FR)

( * ) Notice: Subject to any disclaimer, the term of this patent is extended or adjusted under 35 U.S.C. 154(b) by 1211 days.

(21) Appl. No.: 12/681,268

(22) PCT Filed: Sep. 18, 2008

(86) PCT No.: PCT/EP2008/062457
§ 371 (c)(1),
(2), (4) Date: Apr. 1, 2010

(87) PCT Pub. No.: WO2009/043734
PCT Pub. Date: Apr. 9, 2009

(65) Prior Publication Data
US 2010/0253141 A1   Oct. 7, 2010

(30) Foreign Application Priority Data

Oct. 3, 2007 (FR) .................................... 07 06951
Jul. 1, 2008 (FR) .................................... 08 03777

(51) Int. Cl.
*G01R 27/26* (2006.01)
*G07C 9/00* (2006.01)
(Continued)

(52) U.S. Cl.
CPC ............ *G07C 9/00309* (2013.01); *E05B 81/78* (2013.01); *H01Q 1/3241* (2013.01); *E05B 81/77* (2013.01); *G07C 2009/00373* (2013.01); *G07C 2009/00793* (2013.01); *G07C 2209/65* (2013.01)

(58) Field of Classification Search
CPC .................................. G01R 1/00; G01R 27/26
USPC ......... 324/658–690; 345/174, 173; 178/18.06
See application file for complete search history.

(56) References Cited

U.S. PATENT DOCUMENTS 5,471,198 A * 11/1995 Newham .................... 340/573.4
5,621,396 A *  4/1997 Flaxl ............................ 340/10.4
(Continued)

FOREIGN PATENT DOCUMENTS

DE      102 06 968 A1    8/2003
DE      103 30 525 A1    6/2005
(Continued)

OTHER PUBLICATIONS

International Search Report w/translation from PCT/EP2008/062457 dated Jan. 30, 2009 (6 pages).
(Continued)

*Primary Examiner* — Patrick Assouad
*Assistant Examiner* — Lamarr Brown
(74) *Attorney, Agent, or Firm* — Osha Liang LLP

(57) ABSTRACT

The invention relates to a device for detecting (CAPT) the presence of an object, that comprises at least one detection member (EA, EB) to which is associated a physical value that varies based on the environment in which said detection member (EA, EB) is located. The invention is characterised in that the physical value provides a variable reference level corresponding to the absence of an object and in that it further comprises a saving device (LOG IC) for saving, upon the emission of a low-frequency signal, a value of the reference level measured before the emission of said low-frequency signal.

36 Claims, 15 Drawing Sheets

(51) Int. Cl.
*E05B 81/78* (2014.01)
*H01Q 1/32* (2006.01)

(56) References Cited

U.S. PATENT DOCUMENTS

| | | | |
|---|---|---|---|
| 5,714,882 A * | 2/1998 | Mehnert et al. | 324/207.15 |
| 5,963,888 A * | 10/1999 | Uhlmann et al. | 702/109 |
| 6,075,520 A * | 6/2000 | Inoue et al. | 345/173 |
| 6,253,133 B1 * | 6/2001 | Sakai et al. | 701/45 |
| 6,366,204 B1 * | 4/2002 | Zannier | 340/561 |
| 6,522,027 B1 * | 2/2003 | Morillon et al. | 307/10.3 |
| 6,657,536 B1 * | 12/2003 | Avenel | 340/5.61 |
| 2002/0041225 A1 * | 4/2002 | Inaba et al. | 340/5.6 |
| 2003/0016008 A1 * | 1/2003 | Christensen | 324/207.26 |
| 2003/0094942 A1 * | 5/2003 | Friend et al. | 324/244 |
| 2006/0072914 A1 * | 4/2006 | Arai et al. | 396/106 |
| 2006/0287829 A1 * | 12/2006 | Pashko-Paschenko | 701/301 |
| 2007/0159183 A1 * | 7/2007 | Umemura et al. | 324/661 |
| 2007/0205775 A1 * | 9/2007 | Voelkel et al. | 324/662 |
| 2010/0049441 A1 * | 2/2010 | Wirtz | 702/5 |

FOREIGN PATENT DOCUMENTS

| | | |
|---|---|---|
| EP | 0 955 431 A | 11/1999 |
| EP | 1 450 489 A1 | 8/2004 |
| EP | 1 473 426 A1 | 11/2004 |

OTHER PUBLICATIONS

Written Opinion from PCT/EP2008/062457 dated Jan. 30, 2009 (7 pages).

* cited by examiner

DEVICE FOR DETECTING THE PRESENCE OF A USER BY A VEHICLE

FIELD OF THE INVENTION

The present invention relates to a device for detecting the presence of an object, the device comprising at least one detection member which has an associated physical quantity which varies according to the environment in which said detection member is located, and an associated detection method.

It is particularly applicable to the field of motor vehicles.

STATE OF THE ART

Such a presence detection device for motor vehicles makes it possible to detect the presence of an object such as a hand of a user of the vehicle which cooperates with an opening handle of the vehicle, the detection device then making it possible to automatically unlock the vehicle (for example when the hand is inserted into the handle), or making it possible to automatically lock the vehicle (for example when the hand touches the handle).

To this end, the device uses a detection member such as, for example, a set of electrodes, the physical quantity associated with said set being, for example, a capacitance. In this case, an object such as a hand may be detected by this set of electrodes when the capacitance between the set of electrodes varies.

Such a presence detection device may lead to the excitation of a low-frequency antenna which, following the detection of presence of an object sends a low-frequency signal toward an identification object held by the user to check the identity of said identification object. The latter then sends radiofrequency signal toward the antenna in order to be authenticated.

One problem with such a device is that, when the low-frequency signal is being emitted by the antenna, the physical quantity is disturbed by the low-frequency signal. The detection device is therefore jammed and can therefore no longer detect any presence of an object such as a hand so that, when a user places his hand in the handle during the emission of the low-frequency signal and does not remove it until after, such a presence of a hand after the emission of the low-frequency signal is not detected.

OBJECT OF THE INVENTION

The aim of the present invention is to make it possible to detect the presence of an object such as a hand of a user which cooperates with a vehicle handle, when it is present even after the emission of a low-frequency signal.

According to a first object of the invention, this aim is achieved by a device for detecting the presence of an object, the device comprising at least one detection member which has an associated physical quantity that varies according to the environment in which said detection member is located, characterized in that:

the physical quantity delivers a variable reference level corresponding to the absence of an object; and in that it also comprises:
a saving device for saving, during the emission of a low-frequency signal, a value of the reference level measured before the emission of said low-frequency signal.

As will be seen in detail hereinbelow, the value of the saved reference level will serve as a reference for the detection of an object after the emission of the low-frequency signal. Thus, the variation of the physical quantity in relation to this reference level value will always be visible when an object such as a hand is present after the emission of the low-frequency signal. The presence of an object after the emission of the low-frequency signal will thus always be detected.

According to nonlimiting embodiments, the device also offers the following characteristics.

The saving device also makes it possible to:
measure the physical quantity associated with the detection member; and
compare the physical quantity to the saved value of the saved reference level.

The saving device also makes it possible to suspend the variation of the reference level. This makes it possible to fix the value of the reference level which will thus not be modified by the measurements of the physical quantity that are not due to the environment alone.

The suspension of the variation of the reference level is done as soon as the presence of an object is detected or as soon as a low-frequency signal is emitted. This makes it possible to have a saved reference level value before the detection of an object or before the emission of a low-frequency signal.

The saving device makes it possible to release said save after the emission of the low-frequency signal. This makes it possible for the physical quantity to once again deliver a variable reference level when there is no object.

The physical quantity is a capacitance. This makes it possible to have an extended area for detecting an object, all along a vehicle handle for example.

The physical quantity is a light flux. The detection system is then simpler to implement with a light flux.

The detection device also comprises a low-frequency detection element detecting the start of emission of a low-frequency signal. This makes it possible to save a reference level value throughout the duration of the emission of a low-frequency signal.

The detection device is powered by a power supply common to an antenna for emitting a low-frequency signal. This makes it possible to reduce the number of wires, on a vehicle for example.

The detection device is powered, during the emission of a low-frequency signal, by an antenna excitation voltage, said antenna making it possible to emit the low-frequency signal. This makes it possible to power the detection device when its continuous power supply is cut because of the emission of the low-frequency signal.

The detection device is powered by an input voltage and it also comprises an input capacitor for storing energy from the input voltage. This makes it possible to operate the detection member.

The detection device also comprises measuring means associated with a detection member for generating an output electrical quantity when said detection member detects the presence of an object.

The detection device also comprises inhibition means for inhibiting measuring means so that they no longer generate any electrical quantity.

In a first embodiment, the measuring means comprise a current generator associated with each detection member, and an output electrical quantity is a generator output current.

In a second embodiment, the measuring means comprise a single current generator associated with all the detection members, and an output electrical quantity is a generator output current.

In a third embodiment, the measuring means comprise a switch connected to ground associated with each detection member, and an output electrical quantity is a generator output voltage.

In a fourth embodiment, the measuring means comprise a single switch connected to ground associated with all the detection members, and an output electrical quantity is a generator output voltage.

According to a first nonlimiting embodiment, the low-frequency detection element comprises a comparator for detecting a break in the power supply to said detection device. Thus, thanks to the detection of the cut in the continuous power supply, it is known that a low-frequency signal will be sent thereafter.

The comparator makes it possible to compare the voltage at the terminals of the input capacitor with the input voltage. This is a simple means for detecting a break in the continuous power supply to the detection device, such a break indicating a start of emission of a low-frequency signal that will follow.

The inhibition means make it possible to inhibit measuring means when a break in the power supply to said detection device is detected. Thus, the inhibition is done before the start of the emission of a low-frequency signal. It is then possible to be certain that the measuring means are inhibited during the emission of a low-frequency signal.

The inhibition means make it possible to inhibit measuring means when the input voltage is less than the voltage at the terminals of the input capacitor minus a first threshold. Thus, said measuring means no longer generate an electrical quantity and this prevents a detection device that is capacitive from being jammed by an emission of a low-frequency signal. This also makes it possible to filter the spurious signals from the input voltage thanks to the first voltage threshold.

The saving device saves the value of the reference level measured before the emission of a low-frequency signal, until the input voltage is greater than the voltage at the terminals of the input capacitor minus a second threshold. This enables an external controller to once again see the state of the detection device thanks to the current consumed by said detection device, and therefore to see the presence of an object.

The detection device also comprises a first time filter for measuring the duration of the break in power supply and allowing the value of the reference level measured before the emission of the low-frequency signal to be saved only if said duration is greater than a first predetermined time. This prevents any unnecessary saves in the event of power line disturbances.

The detection device also comprises a second time filter for releasing the saving of the value of the reference level measured before the emission of the low-frequency signal, when the input voltage is equal to the voltage at the terminals of the input capacitor for a duration greater than a second predetermined time. This prevents the emission of a low-frequency signal from being confused by an antenna with the restoration of power supply voltage to the detection device by the input voltage. The measuring means are therefore not reactivated during the emission of a low-frequency signal.

According to a second nonlimiting embodiment, the low-frequency detection element comprises a comparator for detecting a resonant signal representative of the emission of a low-frequency signal. This makes it possible to detect the emission of such a low-frequency signal by means of an antenna which is a resonant circuit, such a resonant signal being significantly greater than the antenna power supply voltage.

The low-frequency detection element comprises a peak level detector to allow for a peak level detection from the resonant signal. The peak level detection is simple to implement and will make it possible to detect the emission of a low-frequency signal.

The comparator makes it possible to compare a resonant voltage generated by an antenna and a reference voltage, said antenna making it possible to emit the low-frequency signal. This is a simple means of detecting a resonant signal.

The resonant signal is an image voltage of a resonant current circulating in an antenna making it possible to emit the low-frequency signal. This is a simple means of detecting a resonant signal.

The inhibition means make it possible to inhibit measuring means when the emission of a low-frequency signal is detected. This prevents a low-frequency emission from being jammed by the detection device.

According to a third nonlimiting embodiment, the low-frequency detection element comprises a comparator for detecting a pulsed input signal representative of the emission of a low-frequency signal. This signal is simple to observe.

The low-frequency detection element comprises a peak level detector to allow for a peak level detection from the pulsed input signal. The peak level detection is simple to implement and will make it possible to detect the emission of a low-frequency signal.

The low-frequency detection element also comprises an additional capacitor. This prevents a measuring means from being reengaged in an untimely manner when the input signal becomes continuous again. Furthermore, this makes it possible to detect more rapidly the emission of a low-frequency signal.

The low-frequency detection element also comprises an additional resistor which, associated with a capacitor, allows for the detection to be restarted after the emission of a low-frequency signal. This makes it possible for the capacitor of the filter to be able to be discharged and consequently to deactivate the inhibition of the measuring means of the sensor.

The peak level detector comprises a time constant defined so as to minimize the time to detect the emission of a low-frequency signal by controlling the charging time of said peak level detector. Thus, the emission of the low-frequency signal will have been detected more quickly, it will be possible to save the value of the reference level more quickly and it will be possible to inhibit the measuring means of the sensor more quickly to avoid any untimely reinitialization of said sensor. Loss of the saved reference is therefore avoided.

The peak level detector comprises a time constant defined so as to avoid transient spurious disturbance peaks on the pulsed input signal when charging said peak level detector. This prevents unwanted inhibitions of the measuring means of the sensor.

According to a second object of the invention, it relates to a unit for detecting the presence of an object, characterized in that it comprises:
  a detection device according to one of the preceding characteristics; and
  an antenna for emitting a low-frequency signal.

According to a third object of the invention, it relates to a method for detecting the presence of an object by means of a physical quantity, associated with a detection member, which varies according to the environment in which said detection member is located, characterized in that it comprises steps for:

delivering a variable reference level of the physical quantity corresponding to the absence of an object; and saving, during the emission of a low-frequency signal, a value of the reference level measured before the emission of said low-frequency signal.

According to nonlimiting embodiments, the method also offers the following characteristics.

The method also comprises additional steps for:

measuring the physical quantity associated with the detection member; and comparing the physical quantity to the saved value of the reference level.

The method also comprises the additional step for suspending the variation of the reference level.

The method also comprises the additional step of releasing said save after the emission of the low-frequency signal.

The suspension of the variation of the reference level is performed as soon as the presence of an object is detected or as soon as a low-frequency signal is emitted.

According to a fourth object of the invention, it relates to a computer program product comprising one or more sequences of instructions that can be executed by an information processing unit, the execution of said sequences of instructions making it possible to implement the method according to the preceding characteristic.

BRIEF DESCRIPTION OF THE FIGURES

Other features and benefits of the present invention will be better understood from the description and from the nonlimiting drawings in which.

Figure 1:
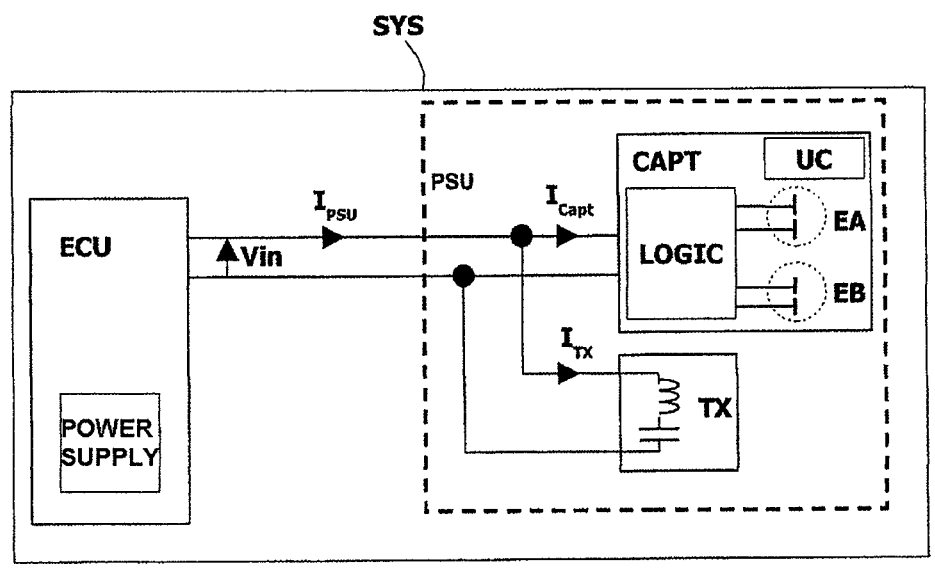
FIG. 1 represents a diagram of a nonlimiting embodiment of a detection unit comprising a detection device and an associated antenna according to the invention.
Figure 4:
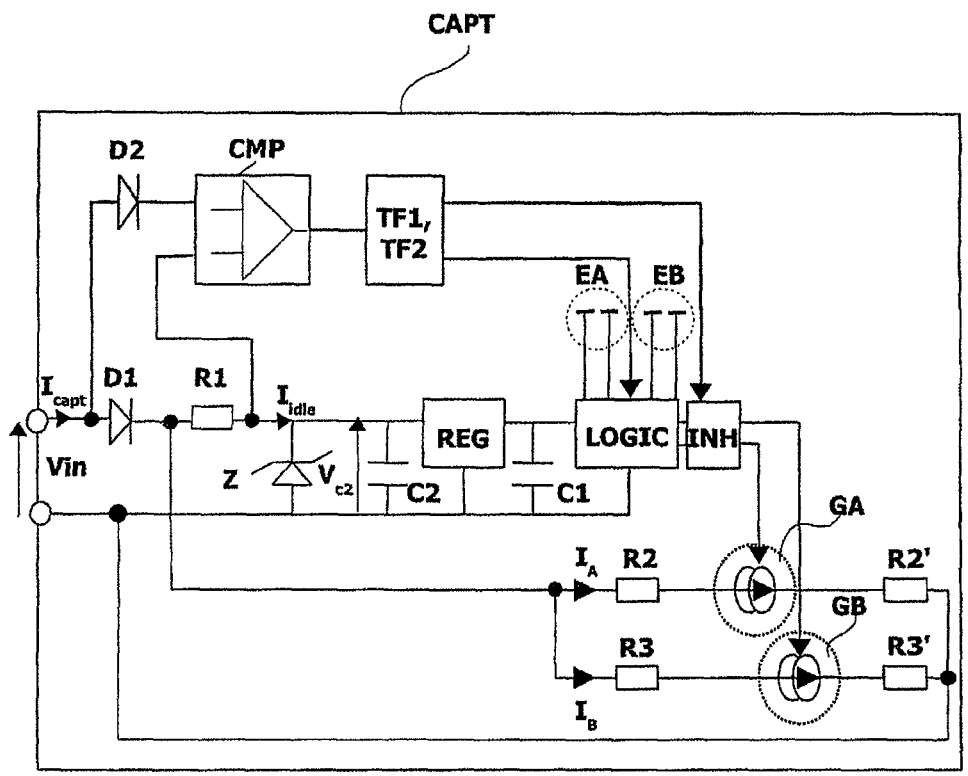
FIG. 4 is a detailed diagram of a first nonlimiting embodiment of the presence detection device of FIG. 1.
Figure 6:
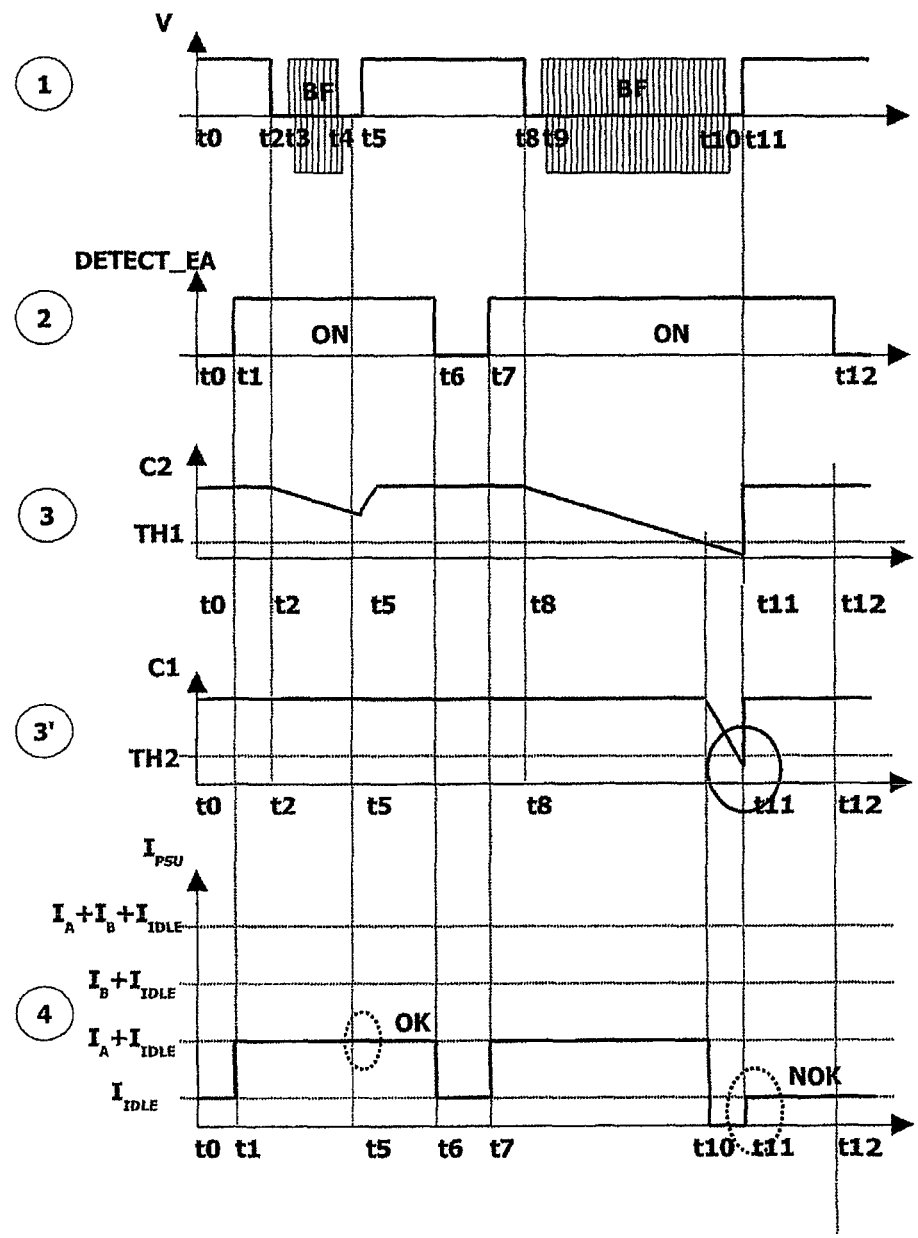
Figure 7:
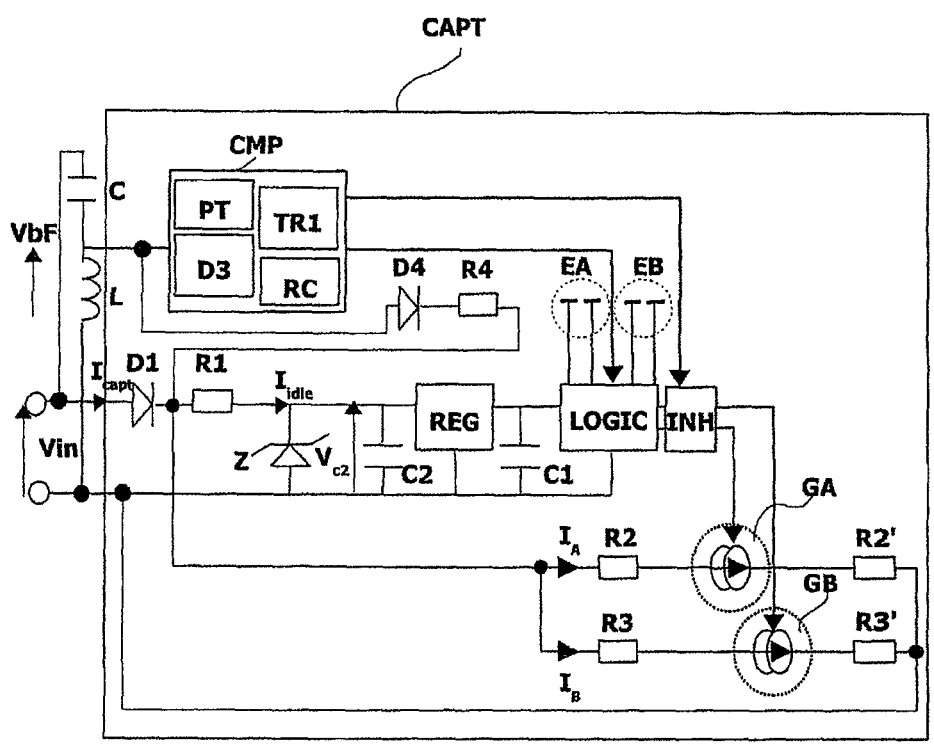
Figure 8:
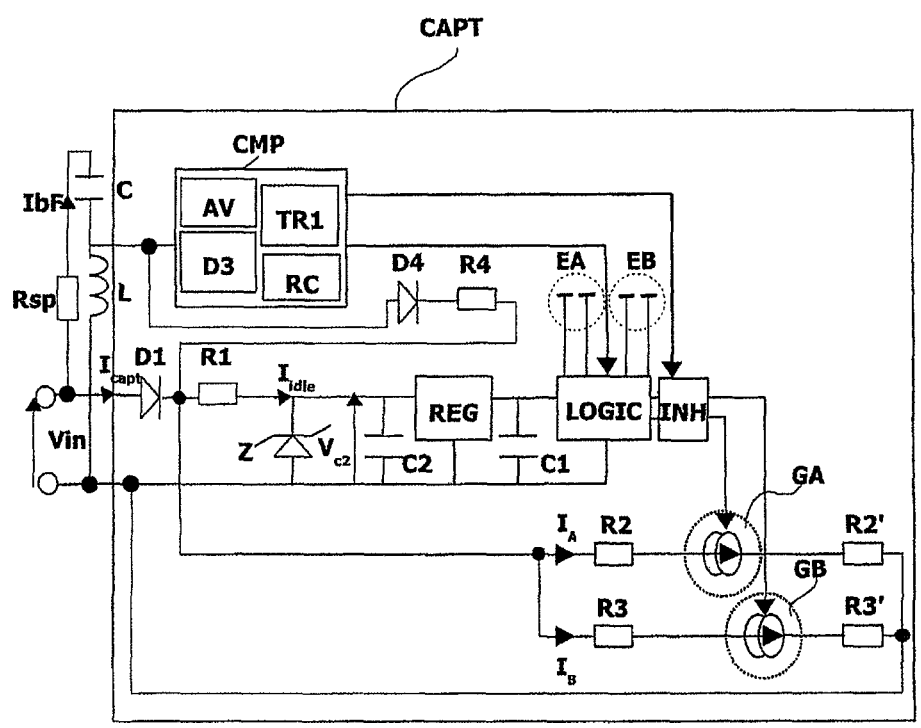
Figure 9:
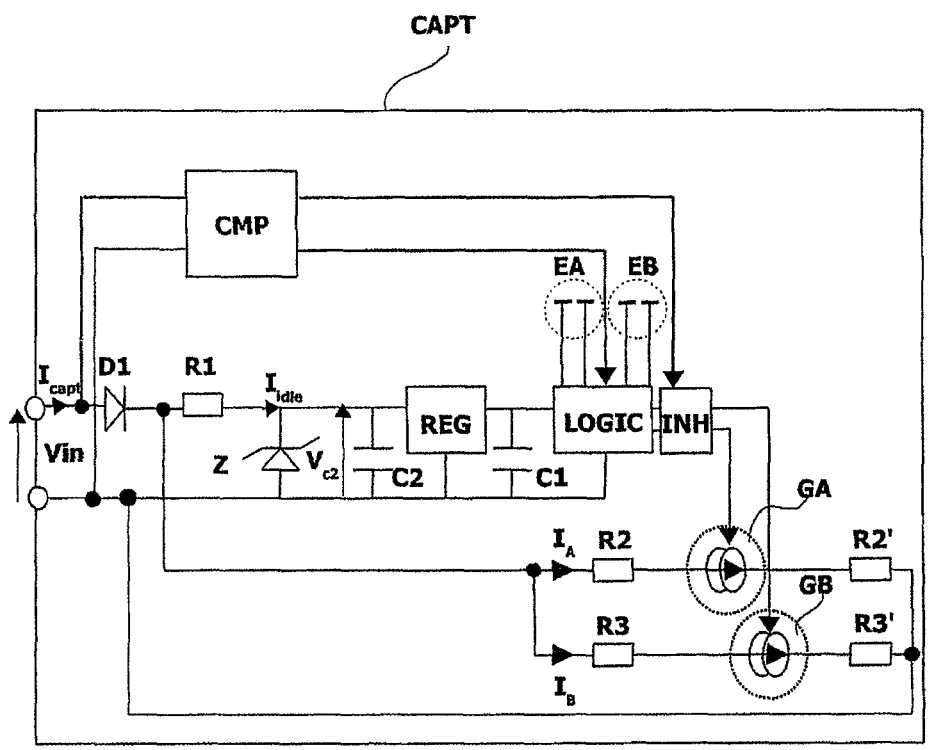
Figure 10:
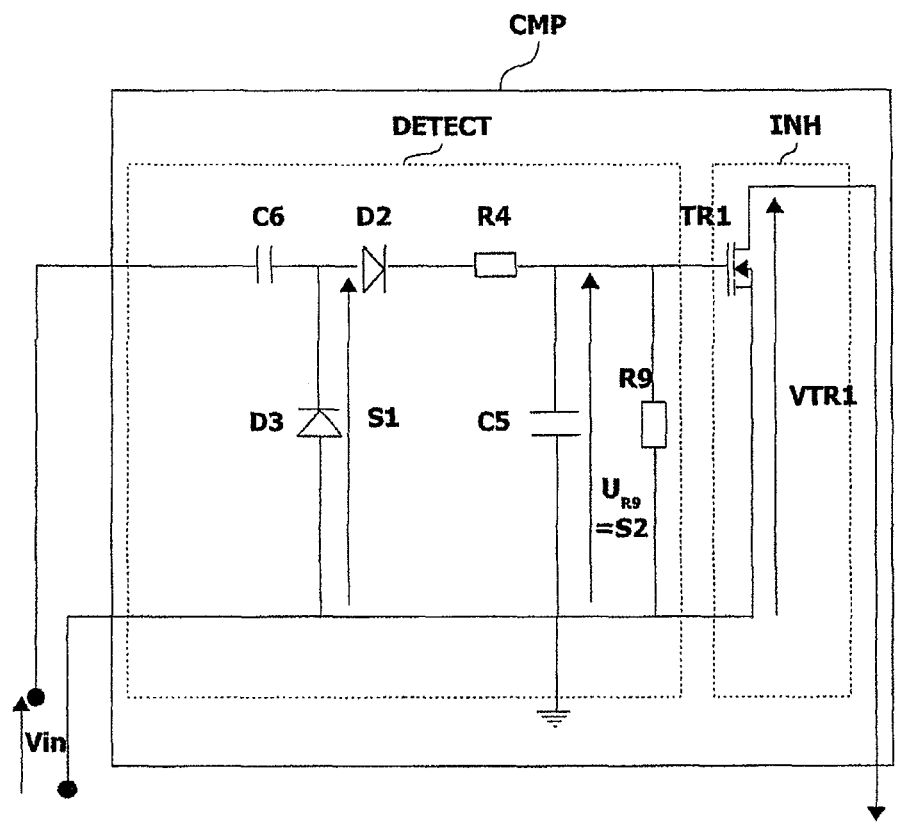
Figure 11:
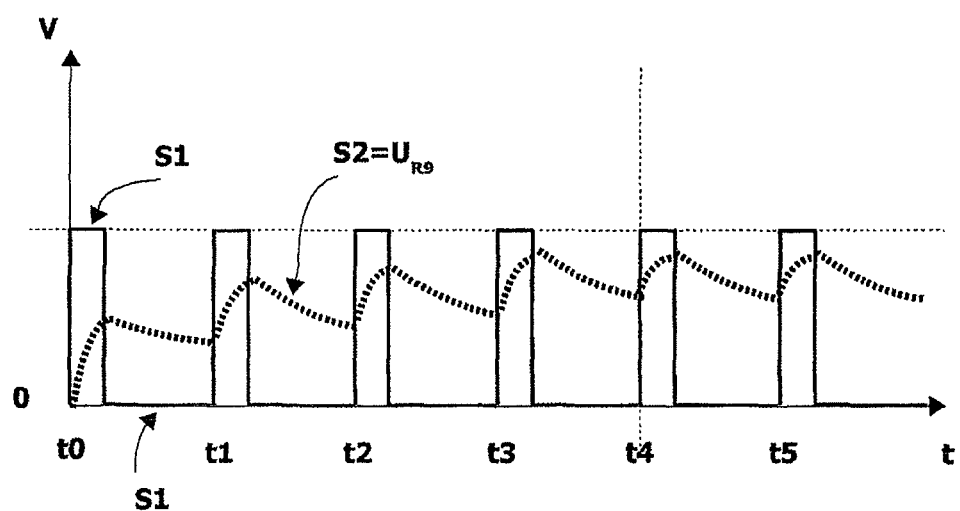
Figure 12:
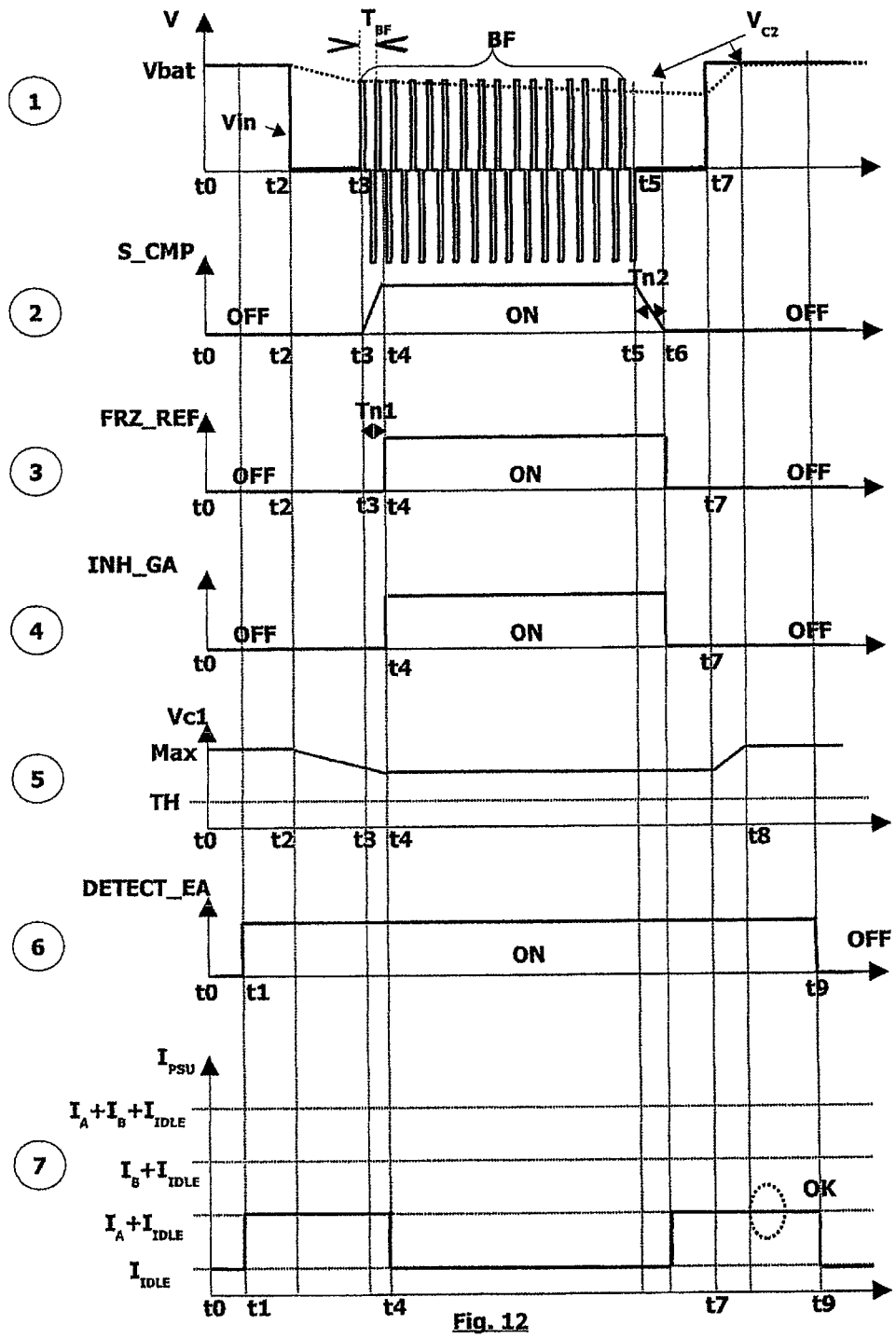
Figure 13:
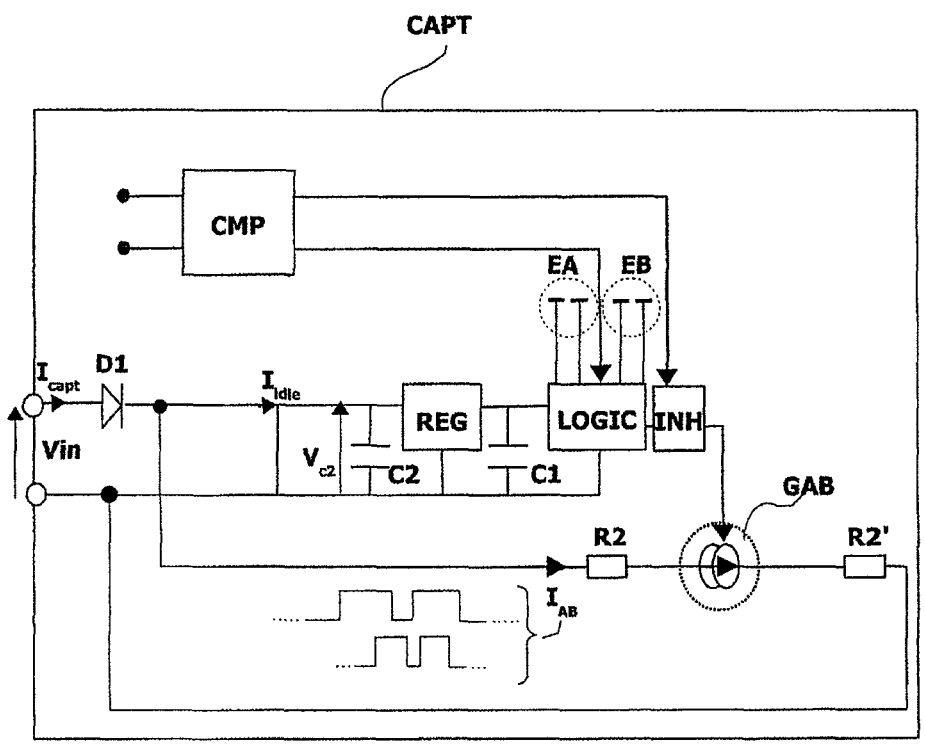
Figure 14:
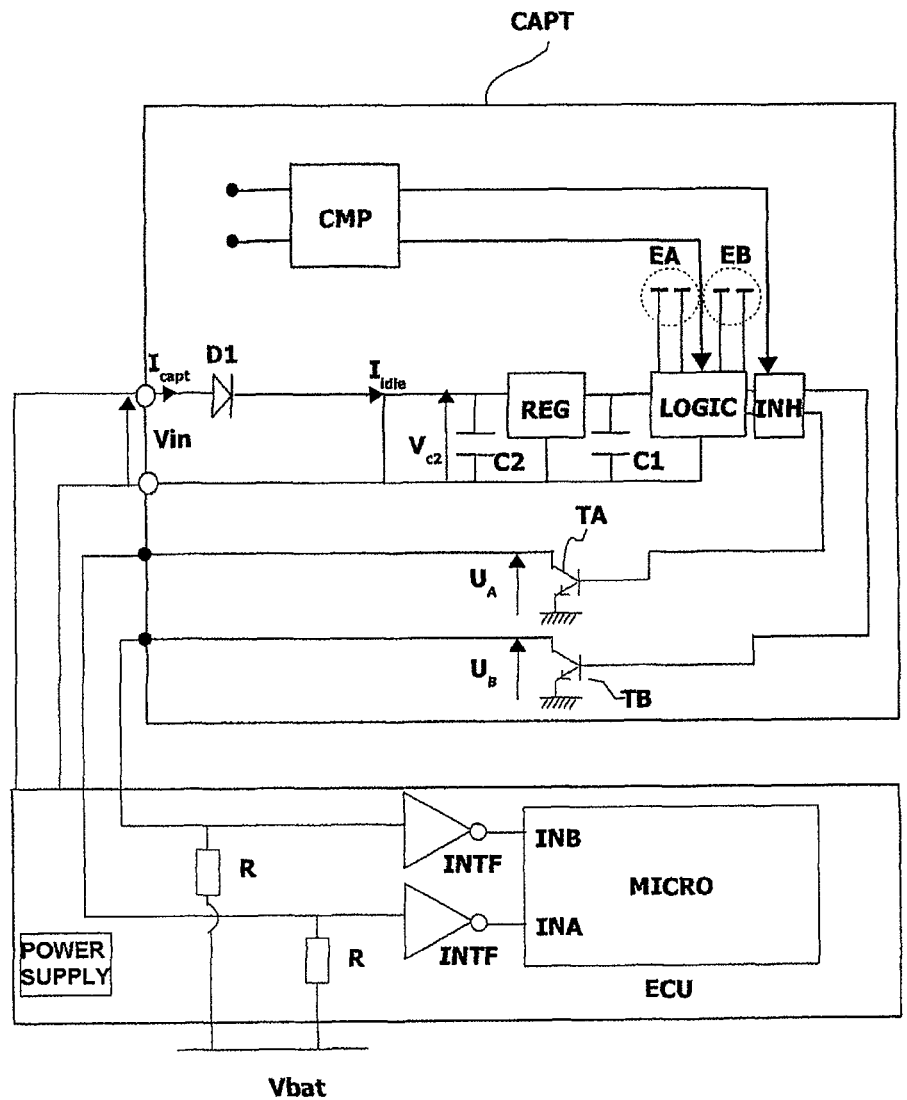
Figure 15:
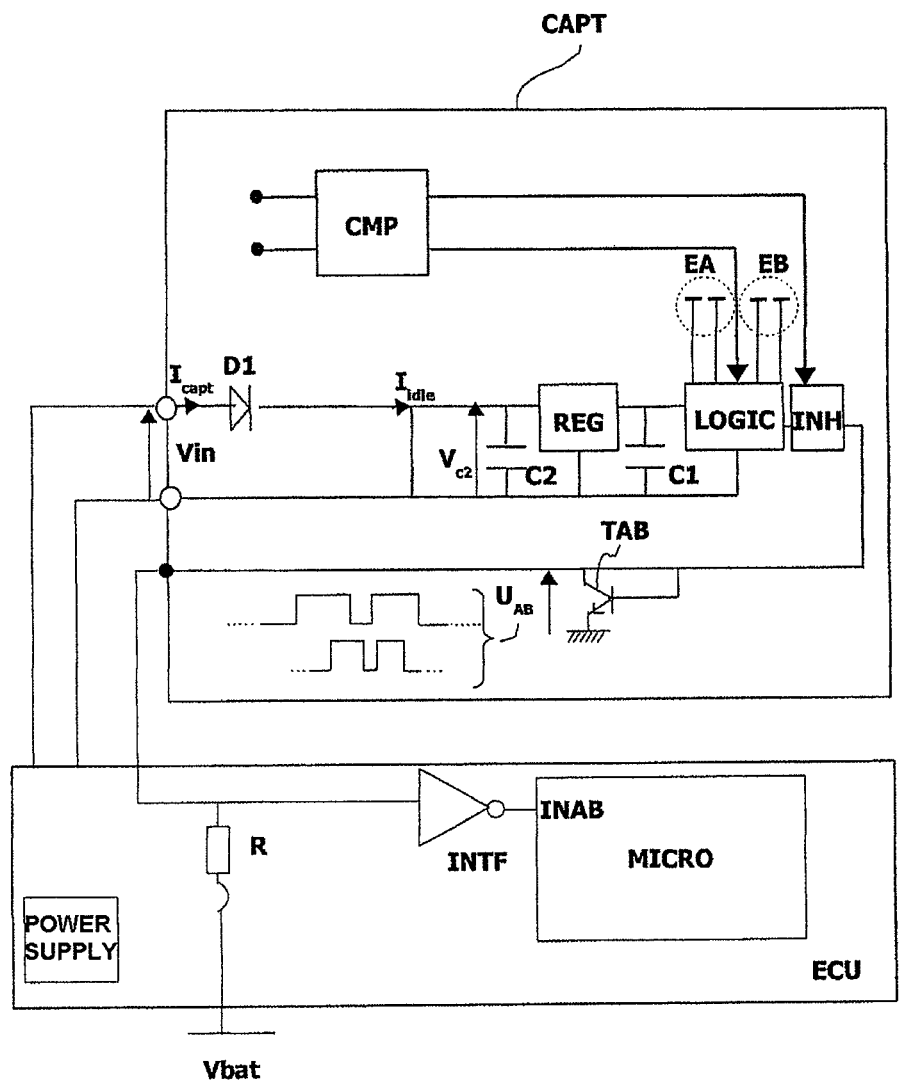

the trend of an input voltage of the presence detection device of FIG. 4 and the trend of a voltage at the terminals of an input capacitor of said device during an emission of a low-frequency signal by a low-frequency antenna cooperating with said device;

the output of a comparator of the presence detection device of FIG. 4;

the freezing states of the configuration of the presence detection device of FIG. 4;

the deactivation/activation states of the current output from the presence detection device of FIG. 4;

the trend of the charge of a capacitor of the presence detection device of FIG. 4;

the presence or not or a hand of a user in a handle of the vehicle, said presence being detected by the presence detection device of FIG. 4; and the trend of the current consumed by the presence detection device of FIG. 1 comprising the presence detection device of FIG. 4;

FIG. 6 represents different diagrams of a presence detection device of the prior art concerning:

the trend of the input voltage of such a presence detection device;

the presence or not of a hand of a user cooperating with a handle of the vehicle, said presence being detected by such a presence detection device;

the trend of the charge of a first capacitor of such a presence detection device;

the trend of the charge of a second capacitor of such a presence detection device; and the trend of the current consumed by a presence detection device comprising such a presence detection device;

FIG. 7 is a detailed diagram of a first variant embodiment of a second nonlimiting embodiment of the presence detection device of FIG. 1;

FIG. 8 is a detailed diagram of a second variant embodiment of a second nonlimiting embodiment of the presence detection device of FIG. 1;

FIG. 9 is a detailed diagram of a third nonlimiting embodiment of the presence detection device of FIG. 1;

FIG. 10 is a detailed diagram of part of the third embodiment of FIG. 9;

FIG. 11 is a diagram schematically showing two output signals from the presence detection device of FIG. 9;

FIG. 12 represents different diagrams concerning:

the trend of an input voltage of the presence detection device of FIG. 9 and the trend of a voltage at the terminals of an input capacitor of said device during an emission of a low-frequency signal by a low-frequency antenna cooperating with said device;

the output of a comparator of the presence detection device of FIG. 9;

the freezing states of the configuration of the presence detection device of FIG. 9;

the deactivation/activation states of the current output from the presence detection device of FIG. 9;

the trend of the charge of a capacitor of the presence detection device of FIG. 9;

the presence or not of a hand of a user in a handle of the vehicle, said presence being detected by the presence detection device of FIG. 9; and the trend of the current consumed by the presence detection device of FIG. 1 comprising the presence detection device of FIG. 9;

FIG. 13 represents a device for detecting the presence of an object of FIG. 1 comprising measuring means according to a second nonlimiting embodiment;

FIG. 14 represents a device for detecting the presence of an object of FIG. 1 comprising measuring means according to a third nonlimiting embodiment; and FIG. 15 represents a device for detecting the presence of an object of FIG. 1 comprising measuring means according to a fourth nonlimiting embodiment.

DETAILED DESCRIPTION OF NONLIMITING EMBODIMENTS OF THE INVENTION

A unit PSU for detecting the presence of an object O comprising a presence device CAPT according to the invention is described in a nonlimiting embodiment in FIG. 1.

It is described for a nonlimiting motor vehicle application. An object O, such as a hand of a user of a motor vehicle, is therefore considered as an example.

The presence detection unit PSU comprises:

at least one detection device CAPT for a motor vehicle V for detecting the presence of a hand of a user of the vehicle cooperating with an opening handle P of the vehicle (with or without contact). The device CAPT is powered by an input voltage (or input voltage) Vin. In a nonlimiting example, the vehicle V comprises between three and five openings (doors, trunk) with an associated handle P.

at least one device CAPT is associated with each handle P. In a nonlimiting example, a handle P comprises two devices CAPT; and an antenna TX for emitting a low-frequency signal BF toward an identification object ID, held by the user of the motor vehicle, so as to check whether the identification object ID is indeed dedicated to the vehicle V. The emission is done either regularly (polling method), or when a presence of a hand that cooperates with a handle P is detected by the device CAPT. The antenna TX is, in a nonlimiting example, placed in the handle P. In a nonlimiting example, it comprises an inductance L (with a ferrite magnetic core) and a capacitance C. Since such an antenna is known to those skilled in the art, it is not described any more in detail here.

It will be noted that the device CAPT and the antenna TX are arranged in proximity to one another (to avoid having excessively long connecting wires) and can be placed in one and the same electronic module or in different modules.

The presence detection unit PSU is linked to a controller ECU, in the example the passenger compartment controller of the vehicle V, which makes it possible to detect the state of the device CAPT by measuring a common current Ipsu consumed by the presence detection unit PSU as will be seen in detail below.

This detection unit PSU in turn forms part of a hands-free system SYS which allows keyless access to the vehicle V. This hands-free system comprises a power supply ALIM making it possible to supply input voltage Vin to said presence detection unit PSU.

In a nonlimiting example, this input voltage Vin is supplied by the battery voltage Vbat of the vehicle, which is, for example, 12 volts. Another voltage value can of course be provided.

In a nonlimiting embodiment, the antenna TX and the detection device CAPT are linked in parallel (on two same wires) as illustrated in FIG. 1. Thus, this enables the detection device CAPT to be powered by a power supply that is common to the antenna TX. The same power supply loom is used for the antenna TX and the device CAPT (the input voltage Vin is therefore the common voltage) which makes it possible to reduce the number of wires needed for the power supply compared to an individual power supply. The number of wires on the vehicle V is thus limited.

In a nonlimiting embodiment, the detection device CAPT is powered, during the emission of a low-emission signal BF (also called BF emission), by a resonant voltage generated by the antenna TX. This makes it possible to power the detection device CAPT when its continuous power supply is cut because of the emission of the low-frequency signal and therefore in particular in the case of a common power supply.

In the context of the vehicle application, the detection device CAPT will make it possible to detect an intention of a user to perform an action on the vehicle. In particular, the device CAPT will make it possible to detect the intention of the user to lock/unlock the vehicle by placing his hand respectively on (and therefore in contact with) an opening handle P of the vehicle/in an opening handle P of the vehicle (with or without contact). More particularly, the detection device CAPT will therefore make it possible to detect a hand that cooperates with an opening handle of the vehicle as will be seen in detail hereinbelow.

The detection device CAPT notably comprises:

at least one detection member EA/EB, linked to a saving device LOGIC, for detecting the presence of a hand that cooperates with a handle P. In a nonlimiting example, it comprises two detection members EA/EB as illustrated in FIG. 1. A physical quantity CE is associated with each detection member EA/EB; and a saving device LOGIC for saving, during the emission of a low-frequency signal, a reference level value REF of the physical quantity CE measured before the emission of said low-frequency signal BF.

In a nonlimiting example, the saving device LOGIC is a control integrated circuit.

Furthermore, it makes it possible to:

measure the physical quantities associated with each detection member EA/EB, scan the variations of the reference level of said physical quantities; and compare the value of the physical quantity CE to the value of the saved reference level REF.

In a first nonlimiting example, the detection device CAPT is capacitive. The detection members EA/EB are sets of electrodes forming a capacitance, the physical quantity associated with each set of electrodes being a capacitance. This makes it possible to have a larger detection area that covers the entire handle P in the case of the motor vehicle application.

In a second nonlimiting example, the detection device CAPT is optical. The physical quantity associated with each detection member EA/EB is a light flux.

The physical quantity CE associated with each detection member EA/EB varies according to:

a) the environment in which said detection member is located, and b) the presence of an object O in proximity to said detection member.

In the first case a), since the environment of a detection member EA/EB is not totally stable because of disturbing elements, such as, for example, a humid atmosphere or external radio waves, etc., which are not linked to the presence of an object O such as a hand of a user, the physical quantity CE associated with the detection member EA/EB exhibits micro-variations due to this environment, these micro-variations being very slow in time also. These micro-variations therefore represent the nature of the environment of the detection member EA/EB. The physical quantity CE associated with each detection member EA/EB thus delivers a variable reference level REF corresponding to the absence of a presence of an object O. The reference level REF therefore takes account of these micro-variations. There is therefore self-adaptation of the reference level REF to its micro-variations.

In the example of a detection member EA/EB such as a set of electrodes, the physical quantity CE is the capacitance of the set of electrodes in this environment.

In the second case b), when an object O approaches a detection member EA/EB so as to disturb its physical quantity CE, the physical quantity exhibits significant variations compared to the variable reference level REF, these significant variations being very rapid in time. It is by comparing the value of the physical quantity in the presence of an object O with a value of the reference level REF that the detection device CAPT is able to deduce the presence of this object O.

Figure 2:
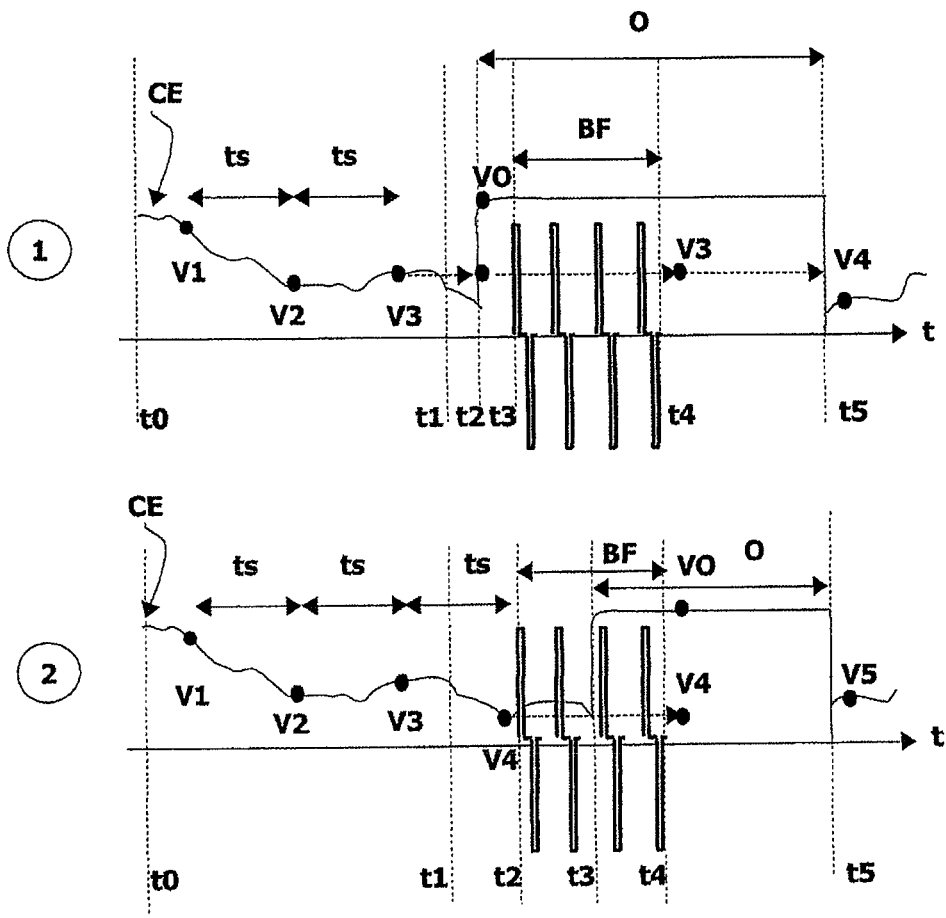
FIG. 2 represents two diagrams explaining the operation of the device for detecting the presence of an object of FIG. 1.

Two exemplary variations of a physical quantity CE are illustrated in FIG. 2, in which:

the first diagram of FIG. 2 illustrates the presence of an object O before the emission of a low-frequency signal BF and which continues after, the second diagram of FIG. 2 illustrates the presence of an object O during the emission of a low-frequency signal BF and which continues after.

The operation of the detection device CAPT is described hereinbelow according to these two scenarios.

Regarding the first diagram of FIG. 2:

Between the times t0 and t1, when there is no object O, the physical quantity CE delivers a variable reference level REF because of the environment of the detection member EA/EB with which it is associated. A value V of this reference level REF is measured and saved according to a predetermined time period is (of the order of a few milliseconds in a nonlimiting example). In this example, three values V1 to V3 have been successively saved, the last value V3 being the most recent. It replaces the preceding value V2 in memory.

At the time t2, when an object O approaches a detection member EA/EB so that it disturbs its environment, for example when a hand O of a user cooperates with an opening handle P comprising said detection member EA/EB, the physical quantity CE associated with the detection member EA/EB also varies. The variations are greater than the micro-variations cited previously.

The detection device CAPT detects these variations by comparing the measured value of the physical quantity CE in the presence of the object O, the value VO illustrated in the diagram, with the value of the reference level REF that was measured and saved last before the detection of the presence of the object O, or in this case the value V3. The comparison indicates the presence of an object O. At this moment, the self-adaptation of the reference level REF of the physical quantity CE is suspended so that the reference level REF is fixed and is not modified by the measurements of the physical quantity CE that are not due to the environment alone. Thus, no other value V of the reference level REF is saved in memory.

At the time t3, a low-frequency signal BF is emitted. The value V3 of the reference level REF is still the last value saved in memory.

At the time t4, the low-frequency signal BF is no longer emitted.

In this case, after the emission of the low-frequency signal BF, the saved value of the reference level REF measured before the emission of the low-frequency signal BF is released. The self-adaptation is thus re-enabled. The self-adaptation of the reference level REF is no longer suspended, the reference level REF is no longer fixed.

However, since the object O is still present, there is no new saving of the value of the reference level REF.

Since the value V3 of the reference level REF is still the value that was measured in the absence of an object O and before the emission of the signal BF, the detection device CAPT detects the presence of the object O after the emission of the low-frequency signal BF, since the comparison is made between the measured value VO of the physical quantity CE at the time t4, or in the presence of the object O, and the value V3.

At the time t5, the object O is no longer in the presence of the detection member EA/EB, a new value of the reference level REF is saved, said value being the value V4. The value of the reference level REF measured before the emission of a low-frequency signal BF, and in this case before the detection of the presence of an object, is thus replaced by the new value V4.

Concerning the second diagram of FIG. 2:

Between the times t0 and t2, when there is no object O, the physical quantity CE delivers a variable reference level REF because of the environment of the detection member EA/EB with which it is associated. A value V of this reference level REF is measured and saved according to a predetermined time period ts. In this example, four values V1 to V4 have been saved in succession, the last value V4 being the most recent.

At the time t2, a low-frequency signal BF is emitted.

At this moment, the self-adaptation of the reference level REF is suspended. The reference level REF is thus fixed. The last value of the reference level saved in memory is therefore the value V4 seen previously.

At the time t3, when an object O approaches a detection member EA/EB so that it disturbs its environment, for example when a hand O of a user cooperates with an opening handle P comprising said detection member EA/EB, the physical quantity CE associated with the detection member EA/EB also varies.

The variations are greater than the micro-variations cited previously.

It will be noted that, in this case, the detection device CAPT does not detect these variations in the following two cases:

In the case where the detection device CAPT is a capacitive device (therefore comprising at least one set of electrodes as detection member EA/EB) the low-frequency signal BF can jam it by capacitive and/or inductive coupling preventing the detection device CAPT from performing a reliable detection of the presence of an object O.

In the case where the detection device CAPT (whether it is capacitive or not) comprises a power supply common with the antenna TX, its continuous power supply is cut during the emission of the low-frequency signal BF by the antenna TX to allow the power supply to said antenna TX, which prevents a detection of the presence of an object O from being performed, as will be seen in detail later (unless it is powered by the resonant voltage Vbf generated by said antenna TX).

At the time t4, the low-frequency signal BF is no longer emitted. The detection device CAPT is no longer jammed, or its continuous power supply is no longer cut. It can thus operate again.

In this case, after the emission of the low-frequency signal, the saved value of the reference level REF measured before the emission of the low-frequency signal BF is released. The self-adaptation is thus reenabled. The self-adaptation of the reference level REF is no longer suspended, the reference level REF is no longer fixed.

However, the object O is still present in the vicinity of a detection member EA/EB so that it disturbs its associated physical quantity CE, so there is no new saving of the value of the reference level REF.

Since the value V4 of the reference level REF is still the value that was measured in the absence of an object O before the emission of the signal BF, the detection device CAPT detects the variation of the physical quantity by comparing the measured value of the physical quantity CE in the presence of the object O, the value VO illustrated, with this value V4. The presence of the object O is thus still detected after the emission of the low-frequency signal BF.

At the time t5, the object O is no longer in the presence of the detection member EA/EB. A new value of the reference level REF is saved, said value being the value V5.

Thus, as soon as the presence of an object is detected (by the measurement of a large variation in the physical quantity CE) or the emission of a low-frequency signal BF is detected, the self-adaptation of the reference level REF of the physical quantity CE is suspended (the value of the reference level REF is fixed) so that the saved value of the reference level REF is the value measured before the detection of an object O or before the emission of a low-frequency signal BF and remains so throughout the emission of the low-frequency signal BF at least, until:
- there is no longer any low frequency signal BF emission, and
- nor is there any presence of an object O in the vicinity of the detection member EA/EB disturbing the associated physical quantity CE or is there an exceeded time delay TIMEOUT (for example beyond 30 seconds). It will be noted that, in the case of an exceeded time delay TIMEOUT, the user must remove his hand and replace it if he wants to execute again at least one comfort function described later.

The save is released after the emission of a low-frequency signal. The self-adaptation is reenabled. However, the latter will be executed (new saving of a new value of the reference level REF) only in the absence of an object O. Therefore, as long as the object O remains after the emission of a low-frequency signal, there is no new save value of the reference level REF (except in the case of a TIMEOUT).

Thus, the reference level REF is not modified by the measurements of the physical quantity CE that represent variations other than those of the environment alone (without object O) in which the detection member EA/EB is located.

In this way, the detection device CAPT can detect the presence of a hand that cooperates with a vehicle opening handle that persists after the emission of a low-frequency signal BF (whether the hand has begun to cooperate with the opening handle before the emission of the low-frequency signal BF or during).

It will be noted that the detection device CAPT can also detect the presence of a hand that has begun to cooperate with a vehicle opening handle before the emission of a low-frequency signal BF and stops cooperating with said handle during said emission BF.

Figure 3:
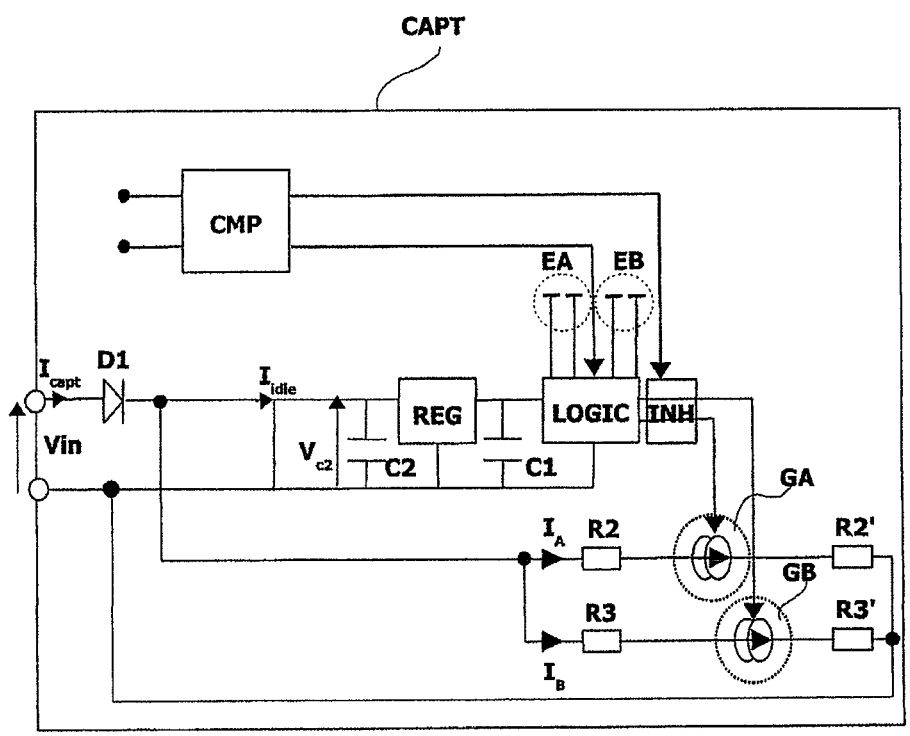
FIG. 3 is a detailed diagram of the device for detecting the presence of an object of FIG. 1 comprising measuring means according to a first nonlimiting embodiment.

The detection device CAPT is described in more detail in FIG. 3.

In addition to the elements described previously, the detection device CAPT comprises:
- at least one measuring means which is, in a nonlimiting embodiment, a current generator GA/GB associated with the detection member EA/EB, in this case there are two current generators GA and GB respectively associated with the two detection members EA/EB;
- a voltage regulator REG for regulating the voltage of the saving device LOGIC;
- an input capacitor C2 for storing the energy received from the input voltage Vin and stabilizing the input voltage of the regulator REG. In a nonlimiting example, the input device C2 is a capacitor;
- a second capacitor C1 for stabilizing the power supply voltage of the saving device LOGIC and thus avoiding power supply variations;
- a first pair of resistors R2-R2' for defining the current $I_A$ of the first current generator GA.
- a second pair of resistors R3-R3' for defining the current $I_B$ from the second current generator GB.

The device CAPT also comprises:
- a low-frequency detection element CMP for detecting the start of an emission of a low-frequency signal BF; and
- inhibition means (INH) for inhibiting the measuring means which is, in this case, a current generator (GA/GB), so that said measuring means (current generator (GA/GB)) no longer generates an output electrical quantity, or in this case the generator output current ($I_A$-$I_B$).

When the detection unit PSU is supplied with voltage by the input voltage Vin illustrated in FIG. 1 and in FIG. 3, it consumes a common current Ipsu illustrated in FIG. 1 and in FIG. 3 also. This common current Ipsu is divided up:
- into an antenna current $I_{tx}$ circulating in the low-frequency antenna TX;
- into a sensor current $I_{CAPT}$ which is in turn divided up into two generator output currents $I_A$ and/or $I_B$ respectively generated by the generators GA and GB when they are active; and
- into a standby current $I_{IDLE}$ for powering the regulator REG and the saving device LOGIC. It will be noted that this standby current $I_{IDLE}$ is significantly less than the two generator output currents $I_A$ and $I_B$.

When the input voltage Vin powers the device CAPT, it is in the form of a continuous voltage, 12 V for example, said device CAPT requiring a continuous power supply. The device CAPT being powered, it allows for a detection of the presence of a hand of a user cooperating with an opening handle P of a vehicle V.

The hand of a user can cooperate with a handle P in different ways, as follows:
- either the hand is placed in the handle P (set of electrodes EA activated);
- or the hand is positioned on the handle P, it is therefore in contact with the latter (set of electrodes EB activated).

When there is such a detection of the presence of a hand of a user cooperating with a handle P, the current generator of the device CAPT GA and/or GB associated with the set(s) of electrodes EA and/or EB which is activated is active. A generator output current $I_A$/$I_B$ respectively associated with each active current generator $G_A$/$G_B$ is thus generated upon the activation of the associated set of electrodes EA/EB.

The general common power supply current Ipsu is then equal to the sum of the generator output currents $I_A$ and/or $I_B$ generated plus the standby current $I_{IDLE}$. It will be recalled that the current Ipsu (therefore $I_A$ and/or $I_B$) enables the controller ECU of the vehicle V to check that there is a presence of a hand cooperating with a handle P.

In practice, the controller of the vehicle ECU makes it possible to measure this consumed common current Ipsu and determine, according to its value, whether:
1) a hand is located in the handle P, with or without contact (Ipsu=$I_A$+$I_{IDLE}$);
2) a hand is located on the handle P (Ipsu=$I_B$+$I_{IDLE}$);
3) a hand is located in the handle P and is on the handle too (Ipsu=$I_A$+$I_B$+$I_{IDLE}$);
4) the absence of any hand (Ipsu=$I_{IDLE}$)

Depending on the measurement of the common current Ipsu, the controller ECU then makes it possible to perform a command on the lock of the vehicle corresponding to the detection made, namely:
- unlocking of the lock in the first case 1);
- locking of the lock in the second case 2);
- determining the priority between unlocking and locking of the lock in the third case 3) and command associated with the priority function;
- do nothing in the last case.

The measuring means, in the example taken the current generators GA/GB, thus making it possible to give information on the states of the detection members EA/EB (activated or not).

Furthermore, depending on the duration with which the hand cooperates with a handle P, the controller ECU will be able to execute at least one comfort function described later.

The antenna TX emits a low-frequency signal BF to allow for the identification/authentication of the identifying object ID held by the user and allow access to the vehicle (whether this emission is initiated after the detection of a hand, or is done continuously by a "polling" method). It will be recalled that the identification of an identification object ID makes it possible to know its serial number, and the authentication, whether simple (performed by the identification object) or mutual (performed by the identification object and the vehicle) makes it possible to check that the identification object ID has rights of access to the vehicle, authentication being done by means of encryption.

In order to operate, the antenna TX is supplied with voltage by the input voltage Vin. To this end, the input voltage Vin becomes a pulsed signal, −12V/0V/+12V for example. In other nonlimiting examples, it is possible to have 0V/12V or −12V/0V. The antenna TX which includes a resonant circuit LC transforms this pulsed signal Vin into a magnetic field so as to communicate with the identification object ID (via a resonant signal Vbf).

The operation of the detection device CAPT is described in more detail in the context of different embodiments described hereinbelow.

Hereinafter in the description, a capacitive detection device CAPT and sets of electrodes are taken as a nonlimiting example as detection members. Furthermore, the presence of an object O such as a hand of a user of a motor vehicle which cooperates with an opening handle of the vehicle is still considered to be a nonlimiting example.

The first set of electrodes EA, called approach electrodes, makes it possible to detect the presence of a hand in a handle P, whether with or without contact, to perform the unlocking of an opening.

The second set of electrodes EB, called tactile electrodes, makes it possible to detect the presence of a hand on the handle P, to perform the locking of an opening, generally when, for example, the hand is located on a specific place of the handle outside of said handle.

In a nonlimiting embodiment, a set of electrodes comprises two electrodes EA1, EA2 and EB1, EB2, the first being an excitation electrode whereas the second is a measuring electrode. The first electrode emits an excitation signal. Field lines between the two electrodes are created and the signal obtained by capacitive and/or inductive coupling between the first electrode and the second electrode is measured (by the control integrated circuit LOGIC). Thus, when a hand is introduced into the handle P without contact or comes into contact with the handle P, the capacitance between the two electrodes decreases rapidly. In practice, the field lines vary in the presence of the hand (some field lines are deflected toward the hand which can be considered to be the ground).

In a second nonlimiting embodiment, a set of electrodes comprises a single electrode that is used with a ground. In this case, it is the capacitance between this electrode and the ground that is measured. On the contrary, the capacitance increases rapidly in the presence of the hand.

The use of such sets of electrodes is well known to those skilled in the art so it is not described in more detail here.

First Embodiment

A first embodiment of the detection device CAPT is illustrated in FIG. 4.

According to this first embodiment, in addition to the characteristics described hereinabove:
a) the antenna TX and the detection device CAPT have a common power supply;
b) the low-frequency detection element CMP is a comparator for comparing the voltage Vc2 at the terminals of its input capacitor C2 and the input voltage Vin.

In a nonlimiting variant embodiment, the comparator CMP is a hysteresis comparator.

c) the inhibition means INH inhibit a current generator GA/GB when the input voltage Vin is less than the voltage Vc2 at the terminals of the input capacitor C2 minus a first threshold Vs1.

In a nonlimiting embodiment, in addition to the characteristics described previously, the device CAPT also comprises:
a first time filter TF1 for measuring the duration $T_c$ of the break in the continuous power supply and authorizing:
the saving of the value of the reference level REF measured before the emission of the low-frequency signal BF only if said duration $T_c$ is greater than a first predetermined time Tp1, and
the inhibition of one (both) current generator(s) GA/GB which is (are) active only if said duration $T_c$ is greater than a first predetermined time Tp1; and
a second time filter TF2 for:
releasing the saved value of the reference level REF measured before the emission of the low-frequency signal BF, when the input voltage Vin is equal to the voltage Vc2 at the terminals of the input capacitor C2 for a duration Tp2 greater than a second predetermined time $T_{BF}$; and
inhibiting one (both) of the current generators that has (have) been inhibited, when the input voltage Vin is equal to the voltage Vc2 at the terminals of the input capacitor C2 for a duration Tp2 greater than a second predetermined time $T_{BF}$.

In a nonlimiting example, the first predetermined time Tp1 is greater than a power supply dropout. In practice, as will be seen later, a check is carried out to see if the output S_CMP of the low-frequency detection element CMP is activated during the first predetermined time Tp1.

In a nonlimiting example, the second predetermined time $T_{BF}$ is a period of emission of a low-frequency signal or a multiple of this period.

In a variant embodiment, the second filter TF2 releases the save when the input voltage Vin is greater than the voltage Vc2 at the terminals of its input capacitor C2 minus a second threshold Vs2 for a duration Tp2 greater than the second predetermined time $T_{BF}$.

It will be noted that the expression "releasing of the save" should be understood to mean that the second time filter TF2 reenables a self-adaptation of the reference level of the associated reference member EA/EB. The self-adaptation is thus no longer suspended.

It will be noted that a single time filter can perform the two filtering functions explained hereinabove. Moreover, in a nonlimiting embodiment, it is possible to take the first time interval Tp1 to be equal to the second time interval Tp2. This makes it possible to simplify the time filtering and simplify the design of the time filter or filters.

Finally, the detection device CAPT also comprises:
a Zener diode Z for protecting the voltage of the voltage regulator REG and thus avoiding overvoltages;
a first resistor R1 for limiting the current consumed in the Zener diode Z in the event of overvoltage on the input voltage Vin and in the input capacitor C2 when the detection device CAPT is powered up;
a first diode D1 in series with the regulator REG for protecting it against reversals of input voltage Vin; and
a second diode D2 in series with the low-frequency detection element CMP for detecting the start of emission of a low-frequency signal to protect it against reversals of input voltage Vin.

The presence detection device CAPT according to this first embodiment described operates as follows.

As will be seen hereinbelow, the comparison between the input voltage Vin and the voltage Vc2 at the terminals of the input capacitor C2 will make it possible to detect a break in the continuous power supply of said device CAPT. It will be noted that this comparison is done continuously or discretely (by sampling).

The start of the emission of a low-frequency signal is thus detected (whether this emission is initiated by the detection of a hand or by a given "polling" method).

In practice, the continuous power supply of the device CAPT is cut because the input voltage Vin is no longer continuous. It is a pulsed voltage which enables the antenna TX to operate. It will be recalled that, in this embodiment, the antenna TX and the detection device CAPT have a common power supply.

At this moment, when such a break in continuous power supply is detected, the value of the reference level REF of the physical quantity CE from the associated detection member EA/EB will be fixed.

Furthermore, the current generators GA and/or GB that are active will be inhibited.

This will make it possible notably to detect the presence of a hand which:
has begun to cooperate with a handle P during the emission of the low-frequency signal BF and continues to cooperate after; and
has begun to cooperate with a handle P before the emission of the low-frequency signal BF and continues to cooperate after.

It will thus be possible to detect the presence of a hand that cooperates for a long time with a handle P, in other words beyond the emission of the low-frequency signal.

Figure 5:
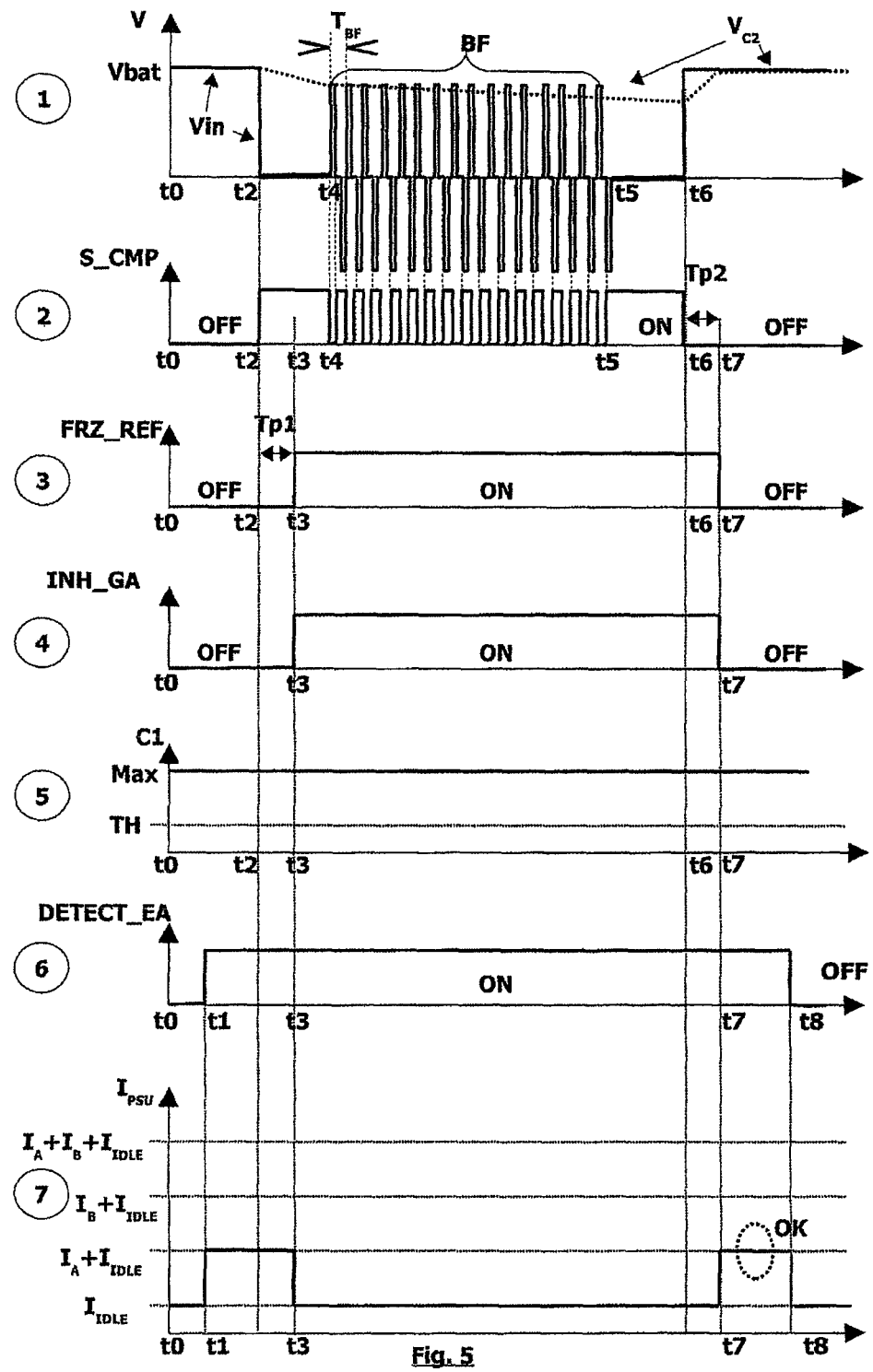
FIG. 5 represents different diagrams concerning.

The diagrams of FIG. 5 make it possible to explain in more detail the operation of the detection device CAPT according to this first embodiment.

It will be noted that, in FIG. 5, the antenna excitation voltage which is in this case the input voltage Vin corresponds to the emission of the low-frequency signal BF.

At the time t0 in the example of FIG. 5, the case applies in which there is no hand that cooperates with an opening handle P of the vehicle V.

The device CAPT is supplied with voltage by the input voltage Vin which is illustrated in FIG. 5 in the first diagram. The device CAPT is inactive (there is no presence of a hand and it is supplied with voltage Vin).

At the time t0, this input voltage Vin is at a voltage of 12 V in the example taken which corresponds to the battery voltage Vbat.

The input capacitor C2 stores the energy given by this input voltage Vin which powers the device CAPT and it is charged. Its voltage Vc2 therefore increases up the input voltage Vin. In the first diagram of FIG. 5, Vc2=Vin.

The second capacitor C1 is also charged up to its maximum Max as illustrated in the fifth diagram of FIG. 5.

It will be noted that the voltage Vc2 of the input capacitor C2 is therefore representative of the input voltage of the device CAPT.

As for the common current Ipsu consumed by the presence detection unit PSU, it is equal to the standby current $I_{IDLE}$, as illustrated in the seventh diagram of FIG. 5 (no current generator GA/GB being active, therefore no generator output current $I_A/I_B$ being generated).

At the time t1, the user places his hand in an opening handle P of the vehicle V. The device CAPT detects the presence of a change of capacitance in the handle P via the detection member EA. It therefore becomes active as does the first current generator GA (ON state), as can be seen in the sixth diagram DETECT_EA of FIG. 5.

At this moment, the common current Ipsu consumed by the presence detection unit PSU is then equal to the generator output current $I_A$ generated by the active current generator GA, and to the standby current $I_{IDLE}$ as illustrated in the seventh diagram of FIG. 5.

At the time t2, following a detection of the presence of a hand of a user that cooperates with a handle P, the input voltage Vin becomes a pulsed signal in order to allow a power supply to the antenna TX so that it can emit a low-frequency signal BF. In this example, the case applies in which the detection of a hand initiates the emission of a low-frequency signal BF. Obviously, the same principle can apply in the "polling" case.

The input voltage Vin therefore drops to zero during a time interval t2-t4 equivalent to the time to initiate the emission of a low-frequency signal BF by the antenna TX.

The continuous power supply for the device CAPT is therefore cut.

When the device CAPT is no longer powered, it is deactivated and becomes autonomous, that is to say that it still includes sufficient energy for a presence detection.

The input capacitor C2 begins to discharge (its voltage Vc2 begins to decrease progressively) as illustrated in the first diagram.

At this moment, the comparator CMP observes a voltage difference between the input voltage Vin and the voltage Vc2 at the terminals of the input capacitor C2 of the device CAPT.

When the voltage difference is such that the input voltage Vin is less than the voltage Vc2 at the terminals of the input capacitor C2 minus a first threshold Vs1, the output S_CMP of the comparator CMP is set to 1 (ON state), at the time t2, as illustrated in the second diagram of FIG. 5.

It will be noted that this first voltage threshold Vs1 follows the variations of the voltage Vc2 of the input capacitor C2 (when it is charging and discharging). This first voltage threshold Vs1 is defined such that it is greater than spurious signals on the input voltage Vin, these spurious signals being able to cause ripples on said input voltage Vin. Thus, this enables the comparator CMP to disregard these ripples.

When such a voltage difference is thus observed, the self-adaptation of the reference level REF of the device CAPT is suspended, as illustrated in the third diagram named FRZ_REF of FIG. 5 (ON state).

The value of the reference level REF of the capacitance of the set of electrodes EA is fixed as explained previously. This means that the last value of the reference level REF which is saved in memory is the value of the reference level measured before the emission of the low-frequency signal BF, or in this case before the cutting of the continuous power supply to the detection device CAPT.

The configuration of the device CAPT is thus frozen.

At the time t3, in a nonlimiting embodiment as illustrated in the third diagram of FIG. 5, the self-adaptation of the reference level REF is suspended when the output S_CMP of the comparator CMP is activated (ON), after a time interval Tp1 greater than a voltage dropout, so that the reference level REF is fixed. This makes it possible not to confuse a dropout and a genuine break in the power supply to the device CAPT, and consequently not to fix the value of the reference level REF each time there is a dropout. Thus, fixing the self-adaptation for nothing is avoided. It will be recalled that a dropout may be due for example to an electromagnetic disturbance or may be due to a connector problem (false contact on a connector).

It will be noted that the emission of a low-frequency signal BF by the antenna TX thus provokes a voltage difference between the input voltage Vin and the voltage Vc2 of the input capacitor C2 as explained previously.

Now, in the case where the device CAPT is a capacitive device, even if the device CAPT remains sufficiently powered (C1 and C2 sufficiently charged) when it no longer has continuous power supply from the general input voltage Vin, that is to say that it is autonomous (the device CAPT can still detect the presence of a hand that cooperates with a handle P), such an emission BF jams said device because of a spurious capacitive and/or inductive coupling between the antenna TX and said capacitive detection device CAPT. Since the antenna TX is in proximity to the detection device CAPT (generally the two elements being in the handle), there is in fact such a spurious capacitive and/or inductive coupling. This may lead to a significant variation in the reference level REF when the device CAPT is autonomous and also bad/false detections of presence of a hand of the user cooperating with a handle P of a vehicle V.

It will be recalled that a bad detection is the fact of not detecting the presence of a hand when there is such a hand cooperating with a handle P, whereas a false detection is the fact of detecting the presence of a hand that cooperates with a handle, when such is not the case.

Fixing the value of the reference level REF of the device CAPT during the emission of a low-frequency signal BF therefore makes it possible to avoid its reference variations and bad/false detections. This therefore provides for immunization against the disturbances generated by the emission of a low-frequency signal BF for the capacitive connection device.

It will be noted that, since the device CAPT is no longer supplied with voltage, it is important for it not to pull the current otherwise the capacitors C1 and C2 will be discharged. It is in fact desirable for it to remain autonomous in order to be able to save its value of the reference level REF. The current generator that is active, the generator GA in the example taken, is therefore inhibited so that the latter can no longer generate generator output current $I_A$. Such an inhibition is illustrated in FIG. 5 in the fourth diagram INH_GA (ON state).

This inhibition operation is performed, when a power supply outage for the detection device CAPT is observed, as in the case where the value of the reference level REF has been fixed.

In order to inhibit a current generator, in nonlimiting examples:
either the current output (state of the output at 0) of the device CAPT that corresponds to the current generator that is active (in this case the generator GA) is deactivated. This deactivation is performed logically by the control integrated circuit LOGIC, the inhibition means INH in this case being the control circuit LOGIC;
or the power supply of the current generator itself, the one that is active (in this case the generator GA), is cut. In a nonlimiting example, the inhibition means INH may be a transistor TR2 which pulls to ground the command for the current generator GA. In practice, in the case of a set of electrodes with two electrodes, the measuring electrode is placed to ground. Its potential is thus fixed at zero. The capacitive measurement is thus forced to zero.

Thus, because of the inhibition of the current generator GA, the common current Ipsu is equal to the standby current $I_{IDLE}$ only, as can be seen in the seventh diagram of FIG. 5, at the time t3. The current generator GA is therefore no longer active.

Such an inhibition prevents the capacitors C1 and C2 from discharging when there is no longer any input voltage Vin powering the sensor CAPT.

In a nonlimiting embodiment as illustrated in the fourth diagram of FIG. 5, as in the case where the value of the reference level REF is fixed, the current generator GA is inhibited when the output S_CMP of the comparator CMP is activated (ON) after a first time interval Tp1 greater than a voltage dropout. This makes it possible not to confuse a dropout with a genuine power supply outage for the device CAPT, and consequently not to inhibit the current generator each time there is a dropout. Thus, an inhibition for no reason is avoided.

It can be seen that, at the time t3, the first capacitor C1 does not discharge as illustrated in the fifth diagram of FIG. 3. In practice, the capacitor is not discharged sufficiently for it to be able to discharge itself (the capacitor C2 may be discharged a little more all the same, but this is due to the fact that the saving device LOGIC and the regulator REG consume a little energy for their own needs, and not the current generator GA), or even the capacitor C2 may be recharged slightly by the antenna excitation voltage Vin.

It will be noted that, between the time t2 and the time t3, that is to say between the cutting of the continuous power supply to the device CAPT and the freezing of its configuration, the capacitor C2 of the device CAPT is discharged a little, as can be seen in the first diagram of FIG. 5, but not sufficiently for the detection device CAPT to be reinitialized and lose its reference level value REF saved previously.

It will be noted moreover that the first time interval tp1 is less than the initiation time between t2 and t4 for the emission of a low-frequency signal BF; otherwise, the value of the reference level REF would be disturbed by the coupling that exists between the antenna TX and the detection members EA/EB of the detection device CAPT.

At the time t4, following the detection of the presence of a hand, the low-frequency signal BF is therefore emitted by the antenna TX in order to interrogate the identification object ID held by the user of the vehicle and check that it is indeed associated with said vehicle V and thus allow access. In return, the identification object ID will send a radiofrequency response RF on a typical frequency (not limiting) of 433 MHz comprising an identification object code enabling it to be identified and encryption data enabling its authentication to allow vehicle access thereafter.

It will be noted that the returning of the radiofrequency response RF is done before the user pulls on the handle P of the vehicle V to open it. The low-frequency signal BF is emitted during a time interval t4-t5 with a defined period $T_{BF}$ of a few microseconds, generally typically corresponding to 125 kHz. Obviously, other frequencies can be used.

Since the antenna TX is operating on a pulsed non-continuous voltage, of −12/0V/12V in the example taken, as can be seen in the first diagram of FIG. 5, at this moment, the input voltage Vin becomes such a pulsed voltage.

Upon the emission of a low-frequency signal BF, at this moment, the comparator CMP still detects the voltage differences between the input voltage Vin and the voltage Vc2 at the terminals of the input capacitor C2 of the device CAPT.

With the input voltage Vin varying from 12V to 0V to −12V, the output S_CMP of the comparator CMP is therefore in the 1 state (or ON) when Vin=0 or Vin=−12V, and in the 0 state (or OFF) when Vin=12V, as can be seen in the example in the second diagram of FIG. 5.

The reference level REF of the device CAPT is still fixed (ON) and the device CAPT is still autonomous (ON) (no input voltage Vin and current generator GA inhibited) as can be seen respectively in the third and fourth diagrams of FIG. 5.

At the time t5, the antenna TX having finished sending the low-frequency signal BF, it is once again possible to restore power to the device CAPT with the input voltage Vin at the time t6 after a latency time. The latter becomes continuous again, and equal to 12V in the example taken, as can be seen in the first diagram of FIG. 5. There is therefore no longer any cutting of the continuous power supply.

The output S_CMP of the comparator CMP, illustrated in the second diagram of FIG. 5, is once again equal to 0 (OFF state), since the continuous input voltage Vin is greater than the voltage of the device Vc2.

Since the device CAPT has power restored, its capacitors C1 and C2 are recharged to its regulation voltage MAX and the input voltage Vin respectively, as can be seen respectively in the fifth and first diagrams of FIG. 5.

When there is no longer any cut in the continuous power supply of the detection device CAPT, it is possible:
to release the saved value of the reference level that was measured before the emission BF, that is to say once again allow self-adaptation (which will be done in the absence of a hand), and
to reactivate (uninhibit) the current generator(s) GA/GB that was (were) inhibited, in this case the generator GA.

In a variant embodiment, it will be noted that, although the device CAPT is once again powered (the voltage of the input capacitor Vc2 is recharged up to its input voltage Vin), the current generator that was inhibited is not subsequently reactivated and the saved value of the reference level that was measured before the emission BF is not released, in other words, the self-adaptation of the reference level REF of the set of electrodes EA is not subsequently enabled.

In practice, upon an emission of a low-frequency signal BF by the antenna TX, the pulsed input voltage Vin varies from −12V to 0V to +12V as seen previously. Now, the output S_CMP of the comparator CMP also shows this variation with the voltage Vc2 as explained previously. There is therefore a risk of considering the low-frequency emission BF to be a restoration of power to the device CAPT (when the pulsed input voltage Vin equals +12V), whereas such is not the case.

To avoid this risk, the second time filter TF2 releases the saved value of the reference level REF measured before the emission of the low-frequency signal BF, that is to say that it reenables the self-adaptation of the reference level REF, when the input voltage Vin is greater than the voltage Vc2 at the terminals of the input capacitor C2 minus a second threshold Vs2 during a second time interval Tp2 greater than the period of emission $T_{BF}$ of a low-frequency signal BF by the antenna TX, or, equivalently, when the output S_CMP of the comparator CMP is activated (ON state) during a second time interval Tp2 greater than the period of emission $T_{BF}$ of a low-frequency signal BF by the antenna TX. This is therefore done at the time t7, as can be seen in the third diagram FRZ_REF of FIG. 5.

At the time t7, the detection device CAPT is therefore re-authorized to once again self-adapt the reference level REF corresponding to the set of electrodes EA (which will be done in the absence of a hand).

It will be noted that the value of the reference level REF that was measured before the emission of the low-frequency signal BF and more particularly before the break in the continuous power supply for the detection device CAPT, is in this case still the value that is saved, because the hand is still detected at the time t7 (sixth diagram DETECT_EA of FIG. 5). The self-adaptation will in reality be done only when the hand is once again absent.

The second time filter TF2 thus makes it possible to filter the emission frequencies of the low-frequency signal BF.

For the same reasons, the second time filter TF2 reactivates the current generator GA that was inhibited:
either by reactivating the current output $I_A$ of the device CAPT (of the current generator GA in the example taken);
or by reactivating its power supply.

When the input voltage Vin is greater than the voltage Vc2 at the terminals of the input capacitor C2 minus a second threshold Vs2 during a second time interval Tp2 greater than the period of emission $T_{BF}$ of a low-frequency signal BF by the antenna TX.

This is therefore done at the time t7, as can be seen in the fourth diagram INH_GA of FIG. 5.

It is allowed to generate the current $I_A$ once again.

The two capacitors C1 and C2 are therefore recharged to the maximum up to the voltage Max and the input voltage Vin respectively, as illustrated respectively in the fifth (capacitor C1) and the first (voltage Vc2 illustrated) diagrams of FIG. 5.

The common current Ipsu is therefore once again equal to the standby current $I_{IDLE}$ and to the current $I_A$ circulating in the active current generator GA.

The measurement of the common current Ipsu by the vehicle controller ECU that is used to see if the device CAPT is active or not, makes it possible to see that it is still active, that is to say that there is still the presence of a hand cooperating with the handle P when the device CAPT is powered by the input voltage Vin.

Thus, even if the user of the vehicle V has left his hand for a long time in (with or without contact) or on the handle P (and therefore with contact), that is to say beyond the emission of the low-frequency signal BF, this hand presence is still detected by the device CAPT. The loss of information concerning the presence of a hand cooperating with the handle P after the emission of the low-frequency signal BF is thus avoided. Detecting a hand-handle cooperation that persists after the emission of a low-frequency signal BF (often referred to as "long press") thus makes it possible to activate comfort functions such as, in non-limiting examples:
raising the windows of the vehicle until the hand is no longer cooperating with the handle P;
raising the top of a car with removable top;
activating the vehicle alarm; and
super-immobilizing the vehicle, that is to say disengaging the interior handles after locking the doors of the vehicle (this prevents a thief from opening the vehicle from the inside using handles after having broken a window for example), etc.

In a nonlimiting example, this "long press" may last up to 30 seconds.

At the time t8, the user of the vehicle V removes his hand from the handle P of the vehicle V as illustrated in the sixth diagram DETECT_EA of FIG. 5 (OFF state). Since the current generator GA is no longer active (OFF state), there is no longer any current $I_A$ circulating. The common current Ipsu becomes equal to the standby current $I_{IDLE}$ only.

The measurement of the common current Ipsu by the vehicle controller ECU makes it possible to see that the detection device CAPT is no longer active, that is to say that there is no presence of a hand cooperating with the handle P concerned.

Thus, the device CAPT described makes it possible to determine the presence of the hand of a user of the vehicle V cooperating with a handle P that lasts for a long time, unlike in the prior art.

In the case of a device according to the prior art, in the event of a "long" presence illustrated in the second diagram of FIG. 6 at the time t7 to t12 for example, the capacitor C1 is fully discharged at the time t11 in the third diagram of FIG. 6 (as is the input capacitor C2) leading to a deactivation of the detection device CAPT and a reset of said device CAPT. Consequently, its saving device LOGIC is reset which leads to a loss of the value of the reference level REF that was saved previously.

The device CAPT is therefore reset to the value of the reference level REF that it measures, which corresponds to that of a hand cooperating with a handle P. It therefore no longer detects the hand cooperating with a handle P since it will compare two identical values.

The common current Ipsu is at this moment equal to the standby current $I_{IDLE}$.

The measurement of this current therefore indicates that no current generator GA/GB is active whereas there is a presence of a hand that cooperates with a handle, the current generator GA having to be active in the example taken.

Thus, the detection device DETECT according to this first embodiment presents notably the following benefits:

- By inhibiting an active current generator of the device CAPT and freezing its configuration before the start of the emission of a low-frequency signal BF by the antenna TX, it becomes possible to avoid, in a certain manner, having the value of the reference level REF of the detection member of the device CAPT changed during the emission of a low-frequency signal BF. Bad/false detections are thus avoided. Furthermore, if the device CAPT is capacitive, this certainly prevents the latter from being jammed;
- It makes it possible not to confuse a break in the continuous power supply to the device CAPT with a power supply dropout, and does so thanks to the first time filter TF1, and consequently not to suspend the self-adaptation of the reference level REF in the event of a dropout and therefore not fix the value of the reference level REF in the event of a dropout;
- It makes it possible not to confuse a restoration of the power supply to the device CAPT with the emission of the low-frequency signal BF, and does so thanks to the second time filter TF2, and consequently not allow for the self-adaptation of the reference level REF upon the emission of the low-frequency signal BF;
- It filters the spurious signals from the input voltage Vin thanks to the first voltage threshold Vs1;
- A hand of a user that comes into the vicinity of the sets of electrodes EA/EB before the BF emission and remains there after said emission remains detected at the end of the BF emission (because the detection device saves, before the BF emission, all of its configuration, and notably its reference level measured before the BF emission); and
- A hand of a user that comes into the vicinity of the sets of electrodes EA/EB during the BF emission and remains there in the vicinity after said emission is detected at the end of the BF emission (because the detection device saves, before the BF emission and throughout the BF emission, all of its configuration, and notably its reference level measured before the BF emission).

Second Embodiment

A second embodiment of the detection device CAPT is illustrated in FIG. 7 and in FIG. 8.

According to this second embodiment, in addition to the characteristics described previously, the detection device CAPT also comprises:

- a Zener diode Z for protecting the voltage from the voltage regulator REG and thus avoiding overvoltages;
- a first resistance R1 to limit the current consumed in the Zener diode Z in the event of overvoltage on the input voltage Vin and in the input capacitor C2 when the detection device CAPT is powered up; and
- a first diode D1 in series with the regulator REG to protect it against battery current reversals.

According to this second embodiment, the detection device CAPT also comprises:

a) the antenna TX and the detection device CAPT which have a power supply in common;
b) the low-frequency detection element CMP for detecting the start of emission of a low-frequency signal to detect a resonant signal representative of an emission of a low-frequency signal BF;
c) the detection device CAPT is powered, during the emission of a low-frequency signal BF, by a resonant voltage Vbf generated by the antenna TX; and
d) the inhibition means INH inhibit a current generator GA/GB as soon as the emission of a low-frequency signal BF is detected.

Regarding point characteristic b), it will be noted that a resonant signal comprises a voltage amplitude greater than the input voltage Vin. This is therefore easier to detect.

In a nonlimiting first variant embodiment, the resonant signal is a resonant voltage Vbf, as illustrated in FIG. 7.

In this variant, in order to obtain the resonant voltage, the antenna TX is accessed directly. Thus, in a nonlimiting example, the resonant voltage Vbf is the voltage at the terminals of the inductance L of the antenna TX. In another example, it can be the voltage at the terminals of the capacitor C of the antenna TX. During the emission of a low-frequency signal BF, the pulsed input voltage Vin induces a resonance on the antenna TX due to the resonant circuit LC. This generates a resonant signal which is an almost sinusoidal voltage called resonant voltage Vbf, this resonant voltage being very much greater at the maximum of the power supply voltage Vin, in this case 12V.

In practice, to sum up, in order to detect the resonant signal, the low-frequency detection element CMP makes it possible to compare the resonant voltage Vbf of the antenna TX and a reference voltage Vref so as to detect the emission of a low-frequency signal BF. By comparing the result of the peak detection with the reference value Vref, a determination is made that if the result is greater than this value Vref, there is a resonant signal, and that there is therefore a low-frequency emission BF.

In a nonlimiting example, the low-frequency detection element CMP detecting the start of emission of a BF signal comprises:

a diode D3 associated with filter RC,
the filter RC,
a divider bridge PT (that is resistive in a nonlimiting example), and
a transistor TR1 which supplies a reference voltage Vref of 0.6V in a nonlimiting example.

The diode D3 makes it possible to eliminate the negative component of said resonant signal.

In combination with the filter RC, it also makes it possible to make a peak detection of the rectified signal and obtain an output signal with the peak values detected, this signal being a voltage representative of the resonant signal (image voltage).

The divider bridge makes it possible to divide the output signal so as to be able to compare it with the reference value Vref.

In a second variant embodiment, the resonant signal is a resonant current Ibf. This second variant is illustrated in FIG. 8.

The resonant current Ibf is the current generated by the input voltage Vin that is used as an excitation voltage for the antenna TX.

In this variant, there is no need to have direct access to the antenna as was the case with the first variant described hereinabove. Thus, this variant is advantageous in the case where there is no point of access to the antenna TX.

Moreover, the resonant current Ibf is quasi-sinusoidal and therefore easy to process.

During the emission of a low-frequency signal BF, the pulsed input voltage Vin induces a resonance on the antenna TX due to the resonant circuit LC. This generates a resonant signal which is the current.

In practice, in order to detect the resonant signal, the low-frequency detection element CMP makes it possible to compare an image voltage V1 which is an image of the resonant signal, which is in this case the resonant current Ibf, with a reference voltage Vref so as to detect the emission of a low-frequency signal BF. By comparing the result Vi of the peak detection with the reference value Vref, a determination is made that if the result Vi is greater than this value Vref, there is a resonant signal, and there is therefore a low-frequency emission BF.

To this end, in a nonlimiting example, the low-frequency detection element CMP detecting the start of emission of a signal BF comprises:

- a measuring resistor Rsp,
- a diode D3 associated with a filter RC,
- the filter RC,
- an amplifier AV, and
- a transistor TR1 which supplies a reference voltage Vref of 0.6V in a nonlimiting example.

The measuring resistance Rsp makes it possible to obtain the image voltage V1, an image of the resonant signal Ibf. In a nonlimiting embodiment, the measurement resistance Rsp is low (of the order of a few ohms) so as not to modify the amplitude of the current Ibf. The diode D3 makes it possible to perform a half-wave rectification based on the image voltage V1.

In conjunction with the filter RC, it also makes it possible to make a peak detection of the rectified signal and obtain an output signal with the peak values detected.

The amplifier AV makes it possible to amplify the value of the image voltage V1 in order to be able to compare this image voltage V1 with the reference voltage Vref. In practice, in the case of a low-value measurement resistance Rsp, the image voltage V1 obtained is of low value (in a nonlimiting example, less than 1V).

For the two variant embodiments, for more complete details on the peak detection, reference should be made to the description on the topic in the third embodiment.

In a third variant embodiment, a coupling can be created between the inductance of the antenna TX and an external inductance, and the image voltage can be recovered from the current induced by transformer effect.

Regarding characteristic c), the resonant voltage Vbf is used to maintain the power supply to the detection device CAPT during the emission of a low-frequency signal BF.

In a nonlimiting example, this is carried out by a single diode D4 as illustrated in FIG. 7 and in FIG. 8. In a nonlimiting embodiment, this diode D4 is also associated with a resistor R4 forming a resistive divider bridge with the first resistor R1.

During the emission of a low-frequency signal BF, during a positive half-wave of the pulsed input voltage Vin, the input capacitor C2 is charged. The voltage Vin powers the detection device CAPT.

During a negative half-wave of the pulsed input voltage Vin, the diode D4 is inverted (it is blocked) and therefore prevents the capacitor C2 from discharging to the antenna TX. The input capacitor C2 thus makes it possible always to power the detection device CAPT and in particular the saving device LOGIC and the inhibition means INH.

Thus, during the positive half-wave, the input capacitor C2 is recharged thanks to the resonant voltage Vbf.

It will be noted that the diode D4 and the resistor R4 in association with the resistor R1 are determined such that charging during the positive half-wave is done more rapidly than the discharging of the input capacitor C2 during both positive and negative half-waves of the pulsed input voltage Vin.

Thus, the power supply to the detection device CAPT is maintained.

Regarding characteristic d),

As soon as the emission of a low-frequency signal BF is detected by the low-frequency detection element CMP, the inhibition means INH inhibit a current generator GA/GB.

As seen previously, in nonlimiting examples:

- the inhibition means INH are the control circuit LOGIC which deactivates the current output (state of the output at 0) of the device CAPT corresponding to the current generator which is active (in this case the generator GA);
- the inhibition means INH can be a transistor TR2 which pulls to ground the control of the current generator GA and thus cuts the power supply to the current generator itself, the one that is active (in this case the generator GA). In a nonlimiting example.

As seen previously for the first embodiment, these inhibition means make it possible to prevent the detection device CAPT, and more particularly, the saving device LOGIC, from being reset, and therefore from losing the value of the reference level that was saved previously.

Furthermore, these inhibition means INH avoid having the BF emission disturbed by any power supply consumption on the part of the detection device CAPT, the latter in this case being powered by the resonant voltage Vbf as seen previously, and for the following reasons.

If, during the emission of a low-frequency signal BF, the hand of a user cooperates with a handle so that the detection member EA is activated, the saving device LOGIC of the detection member EA detects it because a current Ipsu equal to $I_A - I_{IDLE}$ is generated.

The current generator GA generates the current $I_A$ when the input voltage Vin is at 0V/+12V (positive half-wave=1st half-phase of the pulsed signal Vin), the first diode D1 being passing.

However, the current generator GA generates no current $I_A$ when the input voltage Vin is at −12V/0V (negative half-wave=2nd half-phase of the pulsed signal Vin), the first diode D1 being blocked.

As seen previously, the common current Ipsu is divided up into a sensor current $I_{CAPT}$ and an antenna current $I_{TX}$.

Thus, when the detection device CAPT is operating without BF emission, the common current Ipsu=$I_{CAPT}$. However, when the detection device CAPT is operating with a BF emission, the common current Ipsu=$I_{CAPT}+I_{TX}$. It will be recalled that this can be done because the detection device is powered by the resonant voltage Vbf.

Thus, $I_{CAPT}=0$ during the negative half-wave(first diode D1 blocked), and $I_{CAPT}=I_A+I_{IDLE}$ or $I_B+I_{IDLE}$ or $I_A+I_B+I_{IDLE}$ during the positive half-wave (first diode D1 passing).

Now, this common current Ipsu is consumed by the antenna TX during the emission of a BF signal.

Since the sensor also consumes a portion of the common current ($I_{CAPT}$), during a positive half-wave of the pulsed input voltage Vin, there is therefore less current circulating in the antenna TX which will distort the resonant signal at the terminals of the antenna TX.

There will thus be a distorted signal during a negative half-wave, and a normal signal during a positive half-wave, which ultimately will induce a distorted resonance signal.

Now, this resonant signal is used to create a magnetic field which will allow communication with an identifying object held by the user. Consequently, the communication will be bad or will be lost and/or there will be a loss of range of the magnetic field deriving from the resonant signal.

Thus, by inhibiting the current generators EA/EB (or the generator EA which is active in the example taken), it becomes possible to prevent the detection device from consuming common current which should be consumed by the antenna TX. Thus, the resonant signal is not distorted and the emission of a BF signal is not jammed.

It will be noted that, in this second embodiment, the saving, during the emission of a low-frequency signal BF, of a value of the reference level REF measured before the emission of said low-frequency signal BF, is performed at least until the end of the emission of the low-frequency signal BF and at least until there is no longer any detection of resonant signal Vbf.

In practice, the end of the emission of a BF signal means that:
  the capacitor of the RC filter is discharged so that
  the transistor TR1 which supplies the reference voltage Vref is blocked.

After the emission of the low-frequency signal BF, the self-adaptation of the reference level REF of the physical quantity CE is therefore re-authorized.

After the emission of the low-frequency signal BF, the self-adaptation will be executed again and a new value of the reference level REF will be saved when:
  the hand of the user is no longer present, or
  when a delay TIMEOUT is exceeded,
as seen previously in the first embodiment.

Thus, this second embodiment notably presents the following benefits:
  the detection device CAPT remains correctly powered, even during the emission of a low-frequency signal BF. It can therefore continue to detect the presence of an object such as the presence of a hand;
  the detection device CAPT is not disturbed by the low-frequency emission BF when it is capacitive;
  a hand of a user that comes within the vicinity of the sets of electrodes EA/EB before the emission BF and remains there after said emission remains detected at the end of the BF emission (because the detection device saves, before the BF emission, all of its configuration, and notably its reference level measured before the BF emission);
  a hand of a user that comes within the vicinity of the sets of electrodes EA/EB during the BF emission and remains there in the vicinity after said emission is detected at the end of the BF emission (because the detection device saves, before the BF emission and throughout the BF emission, all of its configuration, and notably its reference level measured before the BF emission); and
  an emission of a low-frequency signal BF will no longer be disturbed by current consumption by the detection device CAPT, thanks to the inhibition of the current generators (which are active).

Third Embodiment

A third embodiment of the detection device CAPT is illustrated in FIG. 9.

According to this third embodiment, in addition to the characteristics described previously, the detection device CAPT also comprises:
  a Zener diode Z for protecting the voltage of the voltage regulator REG and thus avoiding overvoltages;
  a first resistor R1 for limiting the current consumed in the Zener diode Z in the event of overvoltage on the input voltage Vin and in the input capacitor C2 when the detection device CAPT is powered up; and
  a first diode D1 in series with the regulator REG to protect it against battery current reversals.

According to this third embodiment, the detection device CAPT also comprises:
  a) the antenna TX and the detection device CAPT which have a common power supply;
  b) the low-frequency detection element CMP detecting the start of emission of a low-frequency signal to detect a pulsed input signal representative of an emission of a low-frequency signal BF; and
  c) the inhibition means INH to inhibit a current generator GA/GB as soon as the emission of a low-frequency signal BF is detected.

Regarding characteristic c), the description of the second embodiment described hereinabove applies.

Regarding characteristic b), in a nonlimiting variant embodiment, the pulsed input signal is the input voltage Vin. Thus, to detect the start of emission of a low-frequency signal BF, a search is carried out to determine the moment where the input voltage Vin changes from a continuous voltage of +12V in the example taken to a pulsed voltage of −12V/0V/+12V in the example taken. In practice, as explained previously, during the emission of a low-frequency signal BF, the input voltage Vin is pulsed.

In practice, to sum up, in order to directly detect the pulsed signal Vin, the low-frequency detection element CMP makes it possible to compare the input voltage Vin which powers the sensor CAPT with a reference voltage Vref2 so as to detect the emission of a low-frequency signal BF. Thus, a peak-to-peak detection is carried out on the input signal Vin. By comparing the result of the peak detection with a reference value Vref2, a determination is made that, if the result is greater than this value Vref2, the signal is pulsed and there is therefore a low-frequency emission BF.

In a nonlimiting embodiment, the low-frequency detection element CMP detecting the start of emission of a signal BF comprises, to this end, as illustrated in FIG. 10:
  a second diode D2,
  a third diode D3 associated with a filter R4C5,
  the filter R4C5,
  a fifth resistor R9, and
  a transistor TR1 which supplies a reference voltage Vref2, in a nonlimiting example of 3V.

These elements are described in detail hereinbelow.

The first diode D3 makes it possible to eliminate the negative component from said signal Vin. The first output signal S1, diagrammatically illustrated in FIG. 11, is obtained. This signal is also called peak detector input signal.

The second diode D2 in association with the capacitor C5 makes it possible to make the peak detection of the rectified signal and obtain an output signal S2 with the peak values detected. These two components thus form a peak detector.

In practice, during the positive half-waves of the pulsed input signal Vin (output signal S1 positive), the capacitor C5 of the filter R4C5 is charged via the diode D2, and the resistor R4. It will be noted that a number of positive half-waves are needed to charge the capacitor C5 in relation to the time constant CT45. Moreover, it will be noted that the diode D2 prevents the capacitor C5 from being discharged.

It will be noted that, moreover, when the charging voltage Vch5 of the capacitor C5 is greater than the switching threshold voltage Vref2 of the transistor TR1, the power supply of the current generators can be cut. Thus, as described previously, this avoids using energy stored in the first capacitor C1 and therefore a resetting of the control logic LOGIC of the sensor CAPT is avoided.

The fifth resistor R9 enables the capacitor C5 to be discharged when the second diode D2 is blocked. This resistance is determined so that the discharging of the capacitor C5 is slower than its charging. Thus, in a nonlimiting embodiment, there is a factor of between 10 and 20 between the resistor R4 (enabling said capacitor C5 to be charged) and this resistor R9, the resistor R9 being greater than the resistor R4. This enables the capacitor C5 to be fully discharged when there is no longer any emission of a low-frequency signal BF. Thus, this makes it possible to deactivate the inhibition of the current generators GA/GB so as to render the detection function, that is to say the sensor function, active again.

Without this resistor R9, the capacitor C5 would no longer be discharged and it would no longer be possible to deactivate the inhibition of the current generators.

Thus, during the emission of a low-frequency signal BF, at the output of the filter R4C5 the second output signal S2 illustrated diagrammatically in FIG. 11 is obtained, said signal being a voltage representative of the maximum amplitude of the pulsed input signal Vin. Thus, this output signal S2 (which corresponds to the charging and discharging of the capacitor C5) is therefore representative of the emission of a low-frequency signal BF.

The voltage of the capacitor C5 is in a steady state throughout the emission of the low-frequency signal BF. From this output signal S2, after stabilization, in this case at the time t4 as illustrated in FIG. 11, by taking the peak values, they are compared against the reference voltage Vref2. If they are greater than said reference value Vref2, it can be deduced that the input signal Vin is pulsed and therefore that there is an emission of a low-frequency signal BF. It will be noted that this output signal S2 is also called output voltage $U_{R9}$ hereinbelow (as illustrated in FIG. 10).

The transistor TR1 makes it possible to:
  supply the reference voltage Vref2 for the peak detection, and
  inhibit the current generators GA/GB which are active by connecting them to ground.

A single component is thus used for two functions.

In the case of the inhibition function, when the charging voltage Vch5 becomes greater than the switching threshold voltage Vref2, then the transistor TR1 conducts (it switches). At this moment, the current generator which is active, in the example GA, is blocked (its voltage equals 0). There is no longer any generator output current $I_A$. The current generator GA is therefore inhibited.

In this way, as soon as the low-frequency signal BF is detected, the current generator or generators that is/are active is/are inhibited.

Obviously, in another embodiment, it is possible to use another transistor that is different from the transistor TR1 to perform the inhibition function.

In another embodiment also, it is possible to perform a logical inhibition as described previously in the first and second embodiments.

the components D2 and C5 make it possible to perform the peak detection as explained hereinabove.

The time constant CT45 of the filter R4C5 is defined so as to allow for a rapid peak detection when the emission of a low-frequency signal BF has begun, allowing for a fast charging of the capacitor C5 so as to obtain rapid positive switching (ON state) of the transistor TR1, and thus a rapid detection of the low-frequency emission BF.

Moreover, it will be noted that the pulsed input voltage Vin can include spurious voltage peaks due, for example, to the environment of the motor vehicle, to the noise, the electromagnetic coupling, the electrical loom of the vehicle, etc.

Because of these peaks, the charging voltage Vch5 of the capacitor C5 can increase so as to lead to the switching of the transistor TR1 and the inhibition of the active current generator, in this case GA, as described previously.

In order to avoid such disturbances, in a nonlimiting embodiment, the time constant CT45 of the filter R4C5 is also defined so as to avoid an excessively fast charging of the capacitor C5 and thus not take into account spurious voltage peaks on the pulsed input voltage Vin.

The time constant CT45 is thus defined so as to have a balance between a fast charge in order to rapidly detect the emission of the BF signal but, however, not too fast to avoid the spurious voltage peaks and therefore avoid untimely switchings of the transistor TR1. It will be noted that, in a nonlimiting example, this time constant CT45 is equal to one or two periods $T_{BF}$.

It will be noted that, if the value of the capacitor C5 is too low, the capacitor C5 is charged and discharged very rapidly. This leads to noise on the output voltage $U_{R9}$ (the voltage $U_{R9}$ undergoes variations).

Moreover, having a low capacitor value means that the output voltage $U_{R9}$ is lower.

Having a low voltage and noise leads to a risk of having untimely switchings of the transistor TR1 during the emission of a low-frequency signal, the output voltage $U_{R9}$ risking dropping back below the switching threshold of said transistor TR1. The capacitor C5 therefore influences the detection of the emission of a low-frequency signal.

Furthermore, if the value of the capacitor C5 is low, there is very little filtering between the output voltage $U_{R9}$ and the input voltage S1 of the peak detector. Consequently, when the power supply is restored to the sensor, the switching of the input voltage Vin (for it to become continuous again) to restore power to the sensor is reflected on the input voltage S1 of the peak detector, which in turn is reflected on the output voltage $U_{R9}$. It is therefore possible to observe a voltage peak on the output voltage $U_{R9}$ during the switching of the input voltage Vin. There is therefore a risk that the output voltage $U_{R9}$ will go back above the switching threshold of the transistor TR1, which is not desirable when restoring power to the sensor. The capacitor C5 therefore also influences the immunity of the sensor function.

Moreover, it will be noted that, if the value of the capacitor C5 is too great (compared to the capacitor C6 described later), the charging and discharging time of the capacitor C5 becomes very slow. The variations of the input voltage S1 of the peak detector are filtered and are no longer reflected or reflected very little on the output voltage $U_{R9}$. There is therefore very little noise on said output voltage $U_{R9}$. However, the slower the discharging of the capacitor C5 becomes, the more the time tn2 to return to the blocked state of the transistor TR1 increases. This time tn2 corresponds to a latency time between the end of the low-frequency emission and the return to availability of the sensor function. The greater this latency time tn2 becomes, the less the sensor function is rendered available after the low-frequency emission. In practice, during this latency time tn2, it is not possible to restore power to the sensor because the transistor TR1 is still passing (0 state) and thus blocks the sensor power supply.

Furthermore, the slower the charging time of the capacitor C5 becomes, the slower the detection of the low-frequency emission becomes.

In practice, the higher the value of the capacitor C5, the slower the comparison between the output voltage $U_{R9}$ and the switching threshold voltage of the transistor TR1 becomes. In practice, the higher the value of the capacitor C5, the slower the variations of the input voltage Vin (during the low-frequency emission) will be reflected on the output voltage $U_{R9}$.

Consequently, the detection of the low-frequency emission will be slower (the low-frequency emission being determined by an output voltage $U_{R9}$ greater than the switching threshold voltage of the transistor TR1). Thus, the latency time tn1 that exists for determining the low-frequency emission will be greater.

In conclusion, since the capacitor C5 influences the immunity of the sensor function and the detection of the low-frequency emission, it is essential to determine a value of the capacitor C5 so as to have a good trade-off between the noise on the output voltage $U_{R9}$, a time tn2 for return to availability of the minimum sensor function and a minimum low-frequency emission detection time tn1.

In a nonlimiting embodiment, the return time tn2 is counted in milliseconds, whereas the detection time tn1 is counted in microseconds.

In a nonlimiting example, the return time tn2 is less than or equal to 12 ms. Above this threshold, there is a greater risk that when the user presses on the handle, nothing happens, or that the disappearance of a long press will not be detected.

In another embodiment, the return time tn2 is equal to 2 ms. This makes it possible to reduce energy consumption.

In a nonlimiting example, the detection time tn1 is equal to 128 ms. This makes it possible to detect the first bit of the BF emission.

The voltage divider bridge defined by R9/R4 influences the average value of the output voltage $U_{R9}$ of the peak detector D2C5 during the emission of a low-frequency signal BF.

The higher the value R9/R4, the higher the output voltage $U_{R9}$ of the peak detector D2C5, which allows for a good switching of the transistor TR1 ($U_{R9}$ being very much greater than the switching threshold Vref2 of the transistor TR1), i.e. the high and low levels of the transistor are well discretized relative to one another.

To have a high R9/R4 value, the value of the resistor R4 can be reduced.

However, if the value of the resistor R4 is too low, this leads to a time constant CT45 of the filter R4C5 that is low and therefore a rapid charging and discharging of the capacitor C5. Consequently, there is noise on the voltage $U_{R9}$. This noise leads to a possible aggregation with the switching threshold voltage of the transistor TR1.

Similarly, if the value of the resistor R9, and therefore the ratio R9/R4, is reduced too much, there may be noise on the output voltage $U_{R9}$ and an output voltage that is too low compared to the switching threshold of the transistor TR1.

To reduce this noise, it is possible to increase the value of the resistor R4 and increase the value of the resistor R9.

However, the ratio R9/R4 also influences the immunity of the detection circuit DETECT when the power supply is restored to the detection device CAPT (the restoration of the power supply making it possible to make the sensor function available). In practice, the more the ratio R9/R4 is increased, the more the time tn2 to return the transistor TR1 to the blocked state increases. This time tn2 corresponds to a latency time between the end of the low-frequency emission and the return to availability of the sensor function.

The greater this latency time tn2 becomes, the less available the sensor function becomes after the low-frequency emission. In practice, during this latency time tn2, it is not possible to restore power to the sensor because the transistor TR1 is still passing 0) state and thus blocks the sensor power supply.

In conclusion, since the ratio R9/R4 influences the time tn2 to return to the sensor function and the noise of the output voltage $U_{R9}$, it is essential to regulate this ratio so as to have a good trade-off between a return time that is appropriate to have access once again to the sensor function, and a fairly low noise which does not risk causing the transistor TR1 to switch again.

In a nonlimiting embodiment, the low-frequency detection element CMP detecting the start of emission of a signal BF also includes a fourth capacitor C6, as illustrated in FIG. 10.

In a transitional period, at the end of the low-frequency emission, when the input voltage Vin becomes continuous again and restores power to the sensor CAPT in continuous mode, it changes back from 0V to 12V in the example taken.

In this case, the transition between 0V and 12V leads to the recharging of the capacitor C5. This charging can lead to the inhibition of the active current generator GA as explained previously. It is therefore essential to avoid this inhibition and therefore avoid having the charging voltage Vch5 of the capacitor C5 greater than the switching threshold voltage Vref2 of the transistor TR1 during such a transition.

As with the ratio R9/R4, the ratio C6C5 is defined to avoid this problem and obtain the result described hereinabove.

This fourth capacitor C6 influences the average value of the input voltage S1 of the peak detector D2C5, and therefore its output voltage $U_{R9}$.

The higher the value of the capacitor C6, the greater the average value of the input voltage S1, and the greater the peak value on the output voltage $U_{R9}$, and therefore the better the switching of the transistor TR1 will be (high and low level of the transistor well discretized), as explained previously.

Furthermore, the comparison with the switching threshold voltage of the transistor TR1 will be rapid. In practice, the higher the value of the capacitor C6, the faster the variations of the input voltage Vin (during the low-frequency emission) will be reflected on the output voltage $U_{R9}$.

Consequently, the detection of the low-frequency emission will be faster (the low-frequency emission being determined by an output voltage $U_{R9}$ greater than the switching threshold voltage of the transistor TR1). Thus, the latency time tn1 that exists for determining the low-frequency emission will be lower.

However, the higher the value of the capacitor C6, the more sensitive the detection circuit DETECT becomes when the power supply to the sensor CAPT is restored. In practice, the restoration of power to the sensor CAPT is carried out by the switching of the input voltage Vin (so that it becomes continuous again). The switching of the input voltage Vin leads to voltage peaks on the output voltage $U_{R9}$.

The greater the peak value on the output voltage $U_{R9}$ (because of a high capacitor value C6), the greater the possibility of causing unwanted switchings of the transistor TR1, which therefore risks becoming passing again (0 state). These unwanted switchings would therefore block the restoration of power supply to the sensor.

In conclusion, since the capacitor C6 influences the low-frequency emission detection time tn1 and the immunity of the sensor function (risks of unwanted switchings of the transistor TR1), it is essential to adjust this capacitor C6 so as to have a good trade-off between an appropriate detection time and a reliable restoration of power supply to the sensor.

The detection function is therefore restarted without the detection circuit DETECT disturbing the sensor CAPT.

Thus, this fourth capacitor C6 gives greater robustness compared to the spike in reenabling (ON state) the sensor CAPT.

It will be noted that the value of the capacitor C6 (and therefore the ratio C6/C5) can be reduced provided that the value of the resistor R9 (and therefore of R9/R4) is increased. This makes it possible to increase the immunity of the detection circuit DETECT when the power supply is restored to the sensor function without in any way penalizing either the output voltage $U_{R9}$ of the peak detector D2C5 or the time tn2 for the return to availability of the sensor function.

Thus, a trade-off between the two ratios R9/R4 and C6/C5 is obtained.

The two tables below summarize the influence of the components R4, R9, C6 and C5 seen hereinabove on the latency times tn1, tn2, on the output voltage $U_{R9}$, and on the immunity of the sensor function.

|  | R4 | | R9 | |
|---|---|---|---|---|
| Value | low | high | low | high |
| tn1 | drops | increases | no detection | no influence |
| $U_{R9}$ | increases/ noise increases | decreases | | increases |
| tn2 | no influence | no influence | | increases |
| Sensor immunity | decreases | increases | | decreases |

|  | C6 | | C5 | |
|---|---|---|---|---|
| Value | low | high | low | high |
| tn1 | no detection | decreases | decreases | increases |
| $U_{R9}$ | | increases | more noise | decreases |
| tn2 | | no influence | decreases | increases |
| Sensor immunity | | decreases | decreases | increases |

It will be noted that, in a nonlimiting embodiment, the components R9, R4, C5 and C6 are engineered to operate at the excitation frequency of the voltage Vin (Vin serving as excitation voltage for the antenna TX), which is, in the example taken, 125 kHz. This prevents these components from detecting a spurious noise, and this makes it possible to correctly detect the signal coming from the excitation of the antenna TX, that is to say the emission of a low-frequency signal by the antenna TX.

The diagrams of FIG. 12 explain in more detail the operation of the detection device CAPT according to this third embodiment.

At the time t0 of the example of FIG. 12, the case applies in which there is no hand cooperating with an opening handle P of the vehicle V. The description, given previously for the first embodiment, applies here also. In the interests of conciseness, it will not be repeated. Reference is therefore made to the time t0 described previously in the first embodiment.

At the time t1, the user places his hand in an opening handle P of the vehicle V. The description, given previously for the first embodiment, applies here also. In the interests of conciseness, it will not be repeated. Reference is therefore made to the time t1 described previously in the first embodiment.

At the time t2, following a detection of the presence of a hand of a user cooperating with a handle P, the input voltage Vin becomes a pulsed signal in order to allow power supply to the antenna TX so that it can emit a low-frequency signal BF. This example represents the case in which the detection of a hand triggers the emission of a low-frequency signal BF. Obviously, the same principle can be applied in the "polling" case.

The input voltage Vin therefore drops to zero during a time interval t2-t3 equivalent to the time to initiate the emission of a low-frequency signal BF by the antenna TX.

The continuous power supply of the device CAPT is therefore cut.

When the device CAPT is no longer powered, it is deactivated and becomes autonomous, that is to say it still contains sufficient energy to make a presence detection.

The input capacitor C2 begins to discharge (its voltage Vc2 begins to decrease progressively) as illustrated in the first diagram, as does the capacitor C1 (its voltage VC1 begins to decrease progressively) as illustrated in the fifth diagram.

At the time t3, following the detection of the presence of a hand, the low-frequency signal BF is therefore emitted by the antenna TX in order to interrogate the identification object ID held by the user of the vehicle and check that it is indeed associated with said vehicle V and thus allow access. In return, the identification object ID will send a radiofrequency response RF on a typical (non-limiting) frequency of 433 MHz comprising an identification object code allowing it to be identified and encryption data allowing it to be authenticated to allow vehicle access thereafter.

It will be noted that the returning of the radiofrequency response RF is done before the user pulls on the handle P of the vehicle V to open it.

The low-frequency signal BF is emitted during a time interval t3-t5 with a defined period $T_{BF}$ generally of a few microseconds corresponding typically to 125 kHz. Obviously, other frequencies can be used.

Since the antenna TX is operating on a pulsed non-continuous voltage, of −12V/0V/+12V in the example taken, as can be seen in the first diagram of FIG. 5, at this moment, the input voltage Vin becomes such a pulsed voltage.

At the time t4, the comparator CMP detects the emission of the low-frequency signal BF by the peak detection described previously from the pulsed input signal Vin. The output S_CMP of the comparator CMP is set to 1 (ON state) as illustrated in the second diagram of FIG. 12.

It will be noted that there is a latency time tn1 (between t3 and t4) for the detection which is determined by the time constant CT45 as explained previously.

When the emission of a low-frequency signal BF is thus detected, the self-adaptation of the reference level REF of the device CAPT is suspended, as illustrated in the third diagram named FRZ_REF of FIG. 12 (ON state). The value of the reference level REF of the capacitance of the set of electrodes EA is fixed. This means that the last value of the reference level REF saved in memory is the value of the reference level measured before the emission of a low-frequency signal BF.

The configuration of the device CAPT is thus frozen.

It will be noted that, in the case where the device CAPT is a capacitive device, even if the device CAPT remains sufficiently powered (C1 and C2 sufficiently charged) when it no longer has continuous power supply from the general input voltage Vin, that is to say that it is autonomous (the device CAPT can still detect the presence of a hand cooperating with a handle P), such an emission BF jams said device because of a capacitive and/or spurious inductive coupling between the antenna TX and said capacitive detection device CAPT. Since the antenna TX is in proximity to the detection device CAPT (generally the two elements being in the handle), there is in fact such a capacitive and/or spurious inductive coupling. This can lead to a significant variation in the reference level REF when the device CAPT is autonomous and also bad/false detections of presence of a hand of the user cooperating with a handle P of the vehicle V.

It will be recalled that a bad detection indicates failure to detect the presence of a hand when there is such a hand cooperating with a handle P, whereas a false detection is the fact of detecting the presence of a hand cooperating with a handle when that is not the case.

Fixing the value of the reference level REF of the device CAPT during the emission of a low-frequency signal BF therefore makes it possible to avoid its reference variations and bad/false detections. This therefore makes it possible to be immunized against the disturbances generated by the emission of a low-frequency signal BF for the capacitive connection device.

It will be noted that, since the device CAPT is no longer voltage powered, it is essential to prevent it from pulling the current, otherwise the capacitors C1 and C2 will be discharged. What is in effect wanted is for it to remain autonomous in order to be able to save its value of the reference level REF. The current generator that is active is therefore inhibited, the generator GA in the example taken, so that the latter can no longer generate generator output current $I_4$. Such an inhibition is illustrated in FIG. 12 in the fourth diagram INH_GA (ON state).

This inhibition operation is performed when a detection of low-frequency emission is observed, as in the case where the value of the reference level REF has been fixed.

Moreover, since the device CAPT is no longer voltage powered, it is essential to avoid pulling the current by the current generators GA, GB, because, otherwise, the low-frequency emission is disturbed. In practice, if the detection device CAPT pulls the current, this increases the sensor current Icapt. This leads to a reduction in the antenna current $I_{tx}$ (it will be recalled that the common current Ipsu=Icapt+$I_{tx}$). Reducing the antenna current $I_{tx}$ disturbs the antenna and therefore this can lead to a BF communication fault and/or weaken the antenna range. There is therefore a risk of not recognizing the identification code of a portable object associated with the vehicle and making it possible notably to lock/unlock the vehicle V. Inhibiting the current generators makes it possible to avoid this antenna TX disturbance problem.

In order to inhibit a current generator, the two variant embodiments (logic or by transistor) described previously in the two other embodiments may be used. Thus, because of the inhibition of the current generator GA, the common current Ipsu is equal to the standby current $I_{IDLE}$ only, as can be seen in the seventh diagram of FIG. 12 at the time t4. The current generator GA is therefore no longer active.

Such an inhibition prevents the capacitors C1 and C2 from being discharged too much when there is no longer any continuous input voltage Vin.

It can be seen that, at the time t4, the first capacitor C1 is not discharged as illustrated in the fifth diagram of FIG. 12. In practice, the capacitor C2 is not sufficiently discharged for it to be able to discharge itself (the capacitor C2 may all the same be discharged a little more, but this is due to the fact that the saving device LOGIC and the regulator REG consume a little energy for their own needs, and not the current generator GA as illustrated in the first diagram of FIG. 12), even the capacitor C2 may be recharged slightly by the antenna excitation voltage Vin.

If the capacitor C2 is discharged, it is not discharged sufficiently for the detection device CAPT to be reset and lose its reference level value REF saved previously.

At the time t5, the antenna TX having finished sending the low-frequency signal BF, it is possible once again to restore power to the device CAPT with the input voltage Vin.

The latter becomes continuous again, after a transitional period t5-t7, and is equal to 12V in the example taken, as can be seen in the first diagram of FIG. 12. There is therefore no longer any cut in the power supply Vin for the sensor CAPT.

The output S_CMP of the comparator CMP, illustrated in the second diagram of FIG. 12, is once again equal to 0 (OFF state) at the time t6 after a latency time tn2 linked to a discharging time of the capacitor C5 in association with the resistor R9.

With the device CAPT having its power supply restored, its capacitors C1 and C2 are recharged to the regulation voltage MAX and input voltage Vin respectively, as can be seen respectively in the firth and first diagrams of FIG. 12.

When there is no longer any low-frequency emission from the detection device CAPT, after a transitional period, it is possible:

to release the saved value of the reference level that was measured before the BF emission, that is to say, to once again allow self-adaptation (which will be done in the absence of any hand), and reactivate the current generator or generators GA/GB that has/have been inhibited, in this case the generator GA.

At a time t6, the detection device CAPT is therefore allowed once again to self-adapt the reference level REF corresponding to the set of electrodes EA (which will be done in the absence of any hand), as illustrated in the third diagram FRZ_REF of FIG. 12 (OFF state).

It will be noted that the value of the reference level REF that was measured before the emission of the low-frequency signal BF is still the value that is saved, because the hand is still detected at the time t6 (sixth diagram DETECT_EA of FIG. 12). The self-adaptation will in reality be done only when the hand is once again absent.

Also at the time t6, the common current Ipsu is therefore once again equal to the standby current $I_{IDLE}$ and to the current $I_A$ circulating in the active current generator GA as illustrated in the seventh diagram of FIG. 12.

The measurement of the common current Ipsu by the vehicle controller ECU that is used to see if the device CAPT is active or not makes it possible to see that it is still active, that is to say that there is still the presence of a hand cooperating with the handle P when the device CAPT is powered by the input voltage Vin.

Thus, even if the user of the vehicle V has left his hand for a long time in (with or without contact) or on the handle P (therefore with contact), that is to say beyond the emission of the low-frequency signal BF, this presence of a hand is still detected by the device CAPT. The loss of information on the presence of a hand cooperating with the handle P is thus avoided after the emission of the low-frequency signal BF. Detecting a hand-handle cooperation that lasts after the emission of a low-frequency signal BF (that is often called long press) thus makes it possible to activate comfort functions such as, in nonlimiting examples:

- raising the windows of the vehicle until the hand is no longer cooperating with the handle P;
- removing the top of a car with removable top;
- activating the vehicle alarm; and
- super-locking the vehicle, that is to say disengaging the interior handles after locking the doors of the vehicle (this prevents a thief from opening the vehicle from the inside using the handles after having broken a window for example), etc.

In a nonlimiting example, this "long press" may last up to 30 seconds.

At the time t8, the first capacitor C1 and the second capacitor C2 are recharged up to their regulation voltage MAX and input voltage Vin respectively as illustrated in the fifth and first diagrams respectively.

At the time t9, the user of the vehicle V removes his hand from the handle P of the vehicle V as illustrated in the sixth diagram DETECT_EA of FIG. 12 (OFF state). The current generator GA is no longer active (OFF state), there is no longer current $I_A$ circulating. The common current Ipsu becomes equal to the standby current $I_{IDLE}$ only.

The measurement of the common current Ipsu by the vehicle controller ECU makes it possible to see that the detection device CAPT is no longer active, that is to say that there is no presence of a hand cooperating with the handle P concerned.

It will be noted that, in this third embodiment, the saving, during the emission of a low-frequency signal BF, of a value of the reference level REF measured before the emission of said low-frequency signal BF, is carried out at least up to the end of the emission of the low-frequency signal BF and at least until there is no longer any detection of a pulsed signal Vin.

In practice, the end of the emission of a signal BF means that:

- the capacitor of the filter R9C5 is discharged so that
- the transistor TR1 which supplies the reference voltage Vref2 is blocked.

After the emission of the low-frequency signal BF, the self-adaptation of the reference level REF of the physical quantity CE is therefore re-authorized.

After the emission of the low-frequency signal BF, the self-adaptation will be executed again and a new value of the reference level REF will be saved when:

- the hand of the user is no longer present, or
- when a delay TIMEOUT is exceeded as seen previously in the first and second embodiments.

Thus, this third embodiment notably presents the following advantages.

- It makes it possible to minimize the time to detect the emission of a low-frequency signal BF by checking the charging time of the capacitor C5 using the time constant CT45;
- It makes it possible to restart the detection function by the sensor CAPT in a minimum time after the end of emission of a low-frequency signal BF thanks to the resistor R9, the capacitor C5 and the fourth capacitor C6;
- It makes it possible to avoid the transient spurious disturbances when charging the capacitor C5 thanks to the time constant CT45;
- A hand of a user that comes within the vicinity of the sets of electrodes EA/EB before the emission BF and remains there after said emission remains detected at the end of the BF emission (because the detection device saves, before the emission BF, all of its configuration, and notably its reference level measured before the emission BF);
- A hand of a user that comes within the vicinity of the sets of electrodes EA/EB during the emission BF and remains there in the vicinity after said emission is detected as soon as after the end of the emission BF (because the detection device saves, before the emission BF and throughout the emission BF, all of its configuration, and notably its reference level measured before the emission BF); and
- An emission of a low-frequency signal BF will no longer be disturbed by current consumption by the detection device CAPT, thanks to the inhibiting of the current generators (that are active).

Other Embodiments

Obviously, the three embodiments explained hereinabove are not limiting. It is possible to imagine other embodiments in which:

- the reference level REF is fixed as soon as on the detection of a cut in the continuous power supply of the detection device CAPT as in the first embodiment, but the re-authorization of the self-adaptation is permitted at the end of the emission of the low-frequency signal as in the second or third embodiment. This same principle can be applied for the inhibiting/uninhibiting of a current generator;
- the reference level REF is fixed as soon as upon the detection of a start of emission of a low-frequency signal as in the second or third embodiment, but the re-authorization of the self-adaptation is permitted at the end of the cut in the continuous power supply of the detection device CAPT as in the first embodiment. This same principle can be applied to the inhibiting/uninhibiting of a current generator;
- the first embodiment also includes a detection device CAPT that is powered by a resonant voltage Vbf generated by the antenna TX during the emission of a low-frequency signal, as explained previously;
- the third embodiment also includes a detection device CAPT that is powered by a resonant voltage Vbf generated by the antenna TX during the emission of a low-frequency signal, as indicated previously;

etc.

The presence detection device CAPT according to the invention thus makes it possible to implement the method for detecting the presence of an object O by means of a physical quantity CE, associated with a detection member EA/EB, and that varies according to the environment in which said detection member EA/EB is located, comprising the following steps:

delivering a variable reference level REF of the physical quantity CE corresponding to the absence of an object O; and saving, during the emission of a low-frequency signal BF, a reference level value REF measured before the emission of said low-frequency signal BF.

Moreover, in a nonlimiting embodiment, the method also includes the following additional steps:

measuring the physical quantity associated with the detection member; and comparing the physical quantity to the saved reference level value.

Furthermore, in a nonlimiting embodiment, the method also includes the additional step of suspending the variation of the reference level.

Furthermore, in a nonlimiting embodiment, the method also comprises the additional step of releasing said save after the emission of the low-frequency signal.

Finally, in a nonlimiting embodiment, the suspension of the variation of the reference level is carried out as soon as the presence of an object is detected, or as soon as a low-frequency signal is emitted.

It will be noted that the detection method explained hereinabove can be implemented by means of a microprogrammed "software" device, a hardwired logic and/or "hardware" electronic components.

Thus, the device CAPT can comprise a computer program product PG comprising one or more sequences of instructions that can be executed by an information processing unit such as a microprocessor, or a processing unit of a microcontroller, of an ASIC, of a computer, etc., the execution of said sequences of instructions making it possible to implement the method described.

Such a computer program PG can be written into ROM-type writeable non-volatile memory or into EEPROM- or FLASH-type rewriteable non-volatile memory. Said computer program PG can be written into memory in the factory or else loaded into memory or remotely downloaded into memory. The sequences of instructions may be sequences of machine instructions, or sequences of a command language interpreted by the processing unit at the time of their execution.

In a nonlimiting example, the computer program PG is written into a memory of the control unit UC of the device CAPT.

Obviously, the description of the detection device, of the detection unit and the method is not limited to the embodiments and examples described hereinabove.

Thus, it is possible to have
a capacitive detection device CAPT coupled to a low-frequency emitting antenna TX with a common power supply;
a non-capacitive detection device CAPT (in a nonlimiting example, an optical detection device) coupled to a low-frequency emitting antenna TX with a common power supply;
a capacitive detection device CAPT coupled to a low-frequency emitting antenna TX with two different power supplies.

The first and second cases have been illustrated hereinabove. It will be noted that, with regard to the third case, the invention operates just as well, because in this case, the continuous power supply of the device CAPT is also cut, not to enable the power supply for the antenna TX as in the first two cases, but to avoid a capacitive and/or inductive coupling between the device and the emission of a low-frequency signal BF and consequently prevent said device from being jammed. Because of this, although its power supply has been cut, thanks to the fixing of the reference level at the value measured before the emission of a low-frequency signal, and to the inhibition of the active current generator(s), it is still possible to detect a presence of a hand cooperating with a handle P, even after the emission of a low-frequency signal BF.

Thus, in addition to the embodiment described of the measuring means of the sensor CAPT regarding the current generators GA/GB, the measuring means comprise, in other embodiments:

a single current generator GAB; or
two switches to ground TA/TB; or
a single switch to ground TAB.

Thus, in a second embodiment of the measuring means as illustrated in FIG. 13, the sensor CAPT can comprise a single current generator GAB as measuring means, associated with two detection members EA/EB, which makes it possible to generate a single generator output current $I_{AB}$, the latter being time-coded by the control circuit LOGIC so as to define that the generator output current $I_{AB}$ corresponds to the first detection member EA (set of electrodes) or to the second detection member EB (set of electrodes). The controller ECU of the vehicle then decodes the current obtained, by measuring the width of the coding pulses, which makes it possible to know which detection member EA/EB is activated. A determination is thus made as to whether the hand is in the handle or is on the handle as explained previously and it can therefore be deduced whether the locking and/or unlocking function must be activated.

It will be noted that this second embodiment makes it possible to have a single output and therefore reduce the number of wires, and consequently reduce the size of the sensor CAPT. This makes it easier to integrate the sensor CAPT in a vehicle handle.

Moreover, the current coding makes it possible to have a better immunity to electromagnetic interference.

In a variant embodiment, a single current generator GAB, delivering two different currents $I_A$ and $I_B$, can be provided.

In a third embodiment of the measuring means as illustrated in FIG. 14, the sensor CAPT can comprise switches to ground TA/TB as measuring means, respectively associated with each detection member EA/EB, that make it possible to each respectively generate a generator output voltage $U_A$, $U_B$.

In a nonlimiting embodiment, the switches connected to ground TA/TB are open-collector transistors. The controller ECU of the vehicle in this case comprises:

a resistor R associated with each switch TA/TB; and
an input interface INTF associated with each switch TA/TB connected to a microcontroller MICRO of the controller ECU. In a nonlimiting exemplary embodiment, this input interface is an inverter INV.

When a detection member EA/EB is activated, the associated switch TA/TB delivers a generator output voltage $U_A/U_B$. The controller ECU of the vehicle makes it possible to measure this generator output voltage $U_A/U_B$ by means of the resistor R and the associated input interface INTF, and makes it possible to determine, depending on its value, whether:

1) a hand is located in the handle P, whether with or without contact (voltage INA=5V at the terminals of the microcontroller MICRO, corresponding to $U_A$=0V when the input interface is an inverter INV);

2) a hand is located on the handle P (voltage INB=5V at the terminals of the microcontroller MICRO, corresponding to $U_B$=0V when the input interface is an inverter INV);
3) a hand is located in the handle P and is on the handle too (voltage INA=INB=5V at the terminals of the microcontroller MICRO, corresponding to $U_A$=$U_B$=0V when the input interface is an inverter INV);
4) the absence of any hand (voltage INA=INB=0V at the terminals of the microcontroller MICRO, corresponding to $U_A$=$U_B$=Vbat when the input interface is an inverter INV).

Depending on the voltage measurement, the controller ECU then makes it possible to perform a command on the lock of the vehicle corresponding to the detection made (unlocking and/or locking of the lock or no command) as described previously in the case of the current generator measuring means GA/GB; GAB.

It will be noted that:
when a detection member EA/EB is activated (a hand is present), the corresponding switch TA/TB conducts. At this moment, the voltage generated is equal to $U_A$=$U_B$=0V, or the corresponding voltage INA/INB at the input of the microcontroller MICRO is equal to 0V, or in the case of an inverter input interface, 5V.
when a detection member EA/EB is not activated (a hand is absent), the corresponding switch TA/TB is blocked. At this moment, the voltage generated is equal to $U_A$=$U_B$=Vbat, or the corresponding voltage INA/INB at the input of the microcontroller MICRO is equal to 5V or, in the case of an inverter input interface, 0V.

In a fourth embodiment of measuring means as illustrated in FIG. 15, the sensor CAPT can comprise a single switch to ground TAB as measuring means, associated with the two detection members EA/EB, which makes it possible to generate a single generator output voltage $U_{AB}$, the latter being time-coded by the control circuit LOGIC so as to define that the generator output voltage $U_{AB}$ corresponds to the first detection member EA (set of electrodes) or to the second detection member EB (set of electrodes). The controller ECU of the vehicle measures the voltage obtained $U_{AB}$ by means of a resistor R and an associated interface INTF (which can be an inverter INV) as explained previously, and decodes this voltage $U_{AB}$ by measuring the width of the pulses, which makes it possible to know which detection member EA/EB is activated (by means of a voltage INAB at the terminals of the microcontroller MICRO, corresponding to $U_{AB}$). A determination is thus made as to whether the hand is in the handle or is on the handle as explained previously, and a deduction is therefore made as to whether the locking and/or unlocking function must be activated.

It will be noted that this fourth embodiment makes it possible to have a single output and therefore reduce the number of wires and consequently reduce the size of the sensor CAPT. It is therefore easier to integrate the sensor CAPT in a vehicle handle.

It will be noted that the third and fourth embodiments make it possible to have a sensor CAPT which is based on a voltage measurement, which is simpler to implement than a current measurement.

It will be noted that the second embodiment makes it possible to reduce the number of wires compared to the third and fourth embodiments, the latter respectively requiring two and one additional wires compared to the second embodiment.

It will be noted that the 5V voltage at the terminals of the microcontroller MICRO has been taken as a nonlimiting example.

Obviously, for these embodiments as well, depending on the duration with which the hand cooperates with a handle P, the controller ECU will be able to execute at least one comfort function as described previously.

Thus, the invention notably offers the following benefits:
It makes it possible not only to detect the intention of the user of the vehicle to lock/unlock the vehicle by detecting whether he places his hand respectively, without contact, on a handle/in a handle of an opening of the vehicle, but also to detect the intention of the user to operate a comfort function by detecting a long cooperation with a handle P of an opening (a long press on a handle P or a long positioning in the handle with or without contact);
It avoids:
the energy losses from the capacitors C1 and C2 that would lead to a reset of the saving device LOGIC, and does so thanks to the inhibition of the active current generator; and
subsequently, a reset of the value of the reference level REF of the detection member EA/EB of the device CAPT; and
subsequently, a non-detection of a presence of a hand cooperating with a handle P; and
therefore, also, the non-detection of the presence of a hand cooperating with a handle P after an emission of a low-frequency signal;
Since the device CAPT and the antenna TX are close to one another, it makes it possible to avoid having a device CAPT which is capacitive being jammed by the antenna TX, and does so thanks to the saving, during the emission of a signal BF, of the value of the reference level REF measured before the emission of a signal BF. Consequently, if the user of the vehicle V leaves his hand in the handle P for a long time and/or touches the handle P for a long time, that is to say even after the emission BF, this is detected; and
it avoids having the saving device LOGIC being reset, thanks to the inhibiting of the active current generator, and therefore losing the information that a set of electrodes EA/EB is activated. Bad/false detections are thus avoided.

Obviously, the invention described hereinabove is not limited to the vehicle application described hereinabove. The invention can also be applied to any application requiring the detection of presence of an object in the vicinity of a detection member with the emission of a low-frequency signal. Thus, it is possible to imagine applications such as in the domestic electrical field or in the field of faucets (detecting the passage of the hand under a faucet to initiate a jet of water), etc.

The invention claimed is:
1. A device for detecting the presence of an object, the device comprising:
at least one detection member which has an associated physical quantity that varies according to an environment in which said at least one detection member is located, wherein, in the absence of the object, a variable reference level associated with the physical quantity is generated; and
a saving device for:
periodically saving the variable reference level at a predetermined timing;
measuring the physical quantity associated with the at least one detection member during the emission of a low-frequency signal; and comparing the physical quantity to the saved value of the reference level obtained prior to the emission of the low-frequency signal,
wherein the saving device facilitates:
suspending the periodic saving of the variable reference level as soon as presence of an object is detected or as soon as a low-frequency signal is emitted, and
resuming the periodic saving of the variable reference level after the emission of the low-frequency signal, when the presence of the object is no longer detected, or after a set period of time.

2. The detection device as claimed in claim 1, wherein the physical quantity is a capacitance.

3. The detection device as claimed in claim 1, wherein the physical quantity is a light flux.

4. The detection device as claimed in claim 1, further comprising:
a low-frequency detection element configured to detect the start of emission of a low-frequency signal.

5. The detection device as claimed claim 1, wherein the device is powered by a power supply common to an antenna for emitting a low-frequency signal.

6. The detection device as claimed in claim 1, wherein the device is powered, during the emission of a low-frequency signal, by an antenna excitation voltage, wherein said antenna is used to emit the low-frequency signal.

7. The detection device as claimed in claim 4, wherein the device is powered by an input voltage and further comprises an input capacitor for storing energy from the input voltage.

8. The detection device as claimed in claim 4, further comprising:
measuring means associated with the at least one detection member for generating an output electrical quantity when said detection member detects the presence of an object.

9. The detection device as claimed in claim 8, further:
inhibition means for inhibiting the measuring means so that the measuring means no longer generates the output electrical quantity.

10. The detection device as claimed in claim 8, wherein the measuring means comprise a current generator associated with each of the at least one detection member, and wherein the output electrical quantity is a generator output current.

11. The detection device as claimed in claim 8, wherein the measuring means comprise a single current generator associated with the at least one detection member, and wherein the output electrical quantity is a generator output current.

12. The detection device as claimed in claim 8, wherein the measuring means comprise a switch connected to ground associated with each of the at least one detection member, and wherein the output electrical quantity is a generator output voltage.

13. The detection device as claimed in claim 8, wherein the measuring means comprise a single switch connected to ground associated with the at least one detection member, and wherein the output electrical quantity is a generator output voltage.

14. The detection device as claimed in claim 9, wherein the low-frequency detection element comprises a comparator for detecting a break in a power supply to said detection device.

15. The detection device as claimed in claim 14, wherein the comparator compares a voltage measured at terminals of the input capacitor with an input voltage associated with the power supply.

16. The detection device as claimed in claim 15, wherein the inhibition means is configured to inhibit measuring means when a break in the power supply to said detection device is detected.

17. The detection device as claimed in claim 16, wherein the inhibition means is configured to inhibit measuring means when the input voltage is less than the voltage measured at the terminals of the input capacitor minus a first threshold.

18. The detection device as claimed in claim 17, wherein the saving device saves the value of the reference level measured before the emission of a low-frequency signal, until the input voltage is greater than the voltage at the terminals of the input capacitor minus a second threshold.

19. The detection device as claimed in claim 15, further comprising:
a first time filter for measuring a duration of the break in power supply and allowing the value of the reference level measured before the emission of the low-frequency signal to be saved only if said duration is greater than a first predetermined time.

20. The detection device as claimed in claim 19, further comprising:
a second time filter for releasing the saved value of the reference level measured before the emission of the low-frequency signal, when the input voltage is equal to the voltage at the terminals of the input capacitor for a duration greater than a second predetermined time.

21. The detection device as claimed in claim 9, wherein the low-frequency detection element comprises a comparator for detecting a resonant signal representative of the emission of a low-frequency signal.

22. The detection device as claimed in claim 21, wherein the low-frequency detection element comprises a peak level detector to allow for a peak level detection from the resonant signal.

23. The detection device as claimed in claim 22, wherein the comparator compares a resonant voltage generated by an antenna and a reference voltage, wherein said antenna emits the low-frequency signal.

24. The detection device as claimed in claim 22, wherein the resonant signal is an image voltage of a resonant current circulating in an antenna configured to emit the low-frequency signal.

25. The detection device as claimed in claim 24, wherein the inhibition means inhibit measuring means when the emission of a low-frequency signal is detected.

26. The detection device as claimed in claim 9, wherein the low-frequency detection element comprises a comparator for detecting a pulsed input signal representative of the emission of a low-frequency signal.

27. The detection device as claimed in claim 26, wherein the low-frequency detection element comprises a peak level detector to allow for a peak level detection from the pulsed input signal.

28. The detection device as claimed in claim 26, wherein the low-frequency detection element also comprises an additional capacitor.

29. The detection device as claimed in claim 26, wherein the low-frequency detection element also comprises an additional resistor that is associated with a capacitor, and which allows for the detection to be restarted after the emission of a low-frequency signal.

30. The detection device as claimed in claim 27, wherein the peak level detector comprises a time constant defined to:
minimize the time to detect the emission of a low-frequency signal by controlling the charging time of said peak level detector.

31. The detection device as claimed in claim 27, wherein the peak level detector comprises a time constant defined to:
avoid transient spurious disturbance peaks on the pulsed input signal when charging said peak level detector.

32. A unit for detecting the presence of an object, comprising:
a detection device comprising:
at least one detection member which has an associated physical quantity that varies according to an environment in which said at least one detection member is located, wherein, in the absence of the object, a variable reference level associated with the physical quantity is generated;
a saving device for periodically saving a value of the variable reference level at a predetermined timing,
wherein the saving device measures the physical quantity associated with the at least one detection member during the emission of a low-frequency signal; and compares the physical quantity to the saved value of the reference level obtained prior to the emission of the low-frequency signal;
wherein the saving device facilitates:
suspending the periodic saving of the variable reference level as soon as presence of an object is detected or as soon as a low-frequency signal is emitted, and
resuming the periodic saving of the variable reference level after the emission of the low-frequency signal;
an antenna for emitting the low-frequency signal.

33. A method for detecting the presence of an object by means of a physical quantity, associated with a detection member, which varies according to an environment in which said detection member is located, the method comprising:
periodically saving a variable reference level of the physical quantity corresponding to the absence of the object at a predetermined timing;
measuring the physical quantity associated with the at least one detection member during the emission of a low-frequency signal; and
comparing the physical quantity to the saved value of the reference level obtained prior to the emission of the low-frequency signal,
wherein the saving device facilitates:
suspending the periodic saving of the variable reference level as soon as presence of an object is detected or as soon as a low-frequency signal is emitted, and
resuming the periodic saving of the variable reference level after the emission of the low-frequency signal, when the presence of the object is no longer detected, or after a set period of time.

34. A computer program product comprising one or more sequences of instructions that are executed by an information processing unit, the execution of said sequences of instructions resulting in the execution of a method for detecting the presence of an object by means of a physical quantity, associated with a detection member, which varies according to an environment in which said detection member is located, the method comprising:
periodically saving a variable reference level of the physical quantity corresponding to the absence of the object at a predetermined timing; and
measuring the physical quantity associated with the at least one detection member during the emission of a low-frequency signal; and
comparing the physical quantity to the saved value of the reference level obtained prior to the emission of a low-frequency signal,
wherein the saving device facilitates:
suspending the periodic saving of the variable reference level as soon as presence of an object is detected or as soon as a low-frequency signal is emitted, and
resuming the periodic saving of the variable reference level after the emission of the low-frequency signal, when the presence of the object is no longer detected, or after a set period of time.

35. The detection device as claimed in claim 1, wherein resuming the periodic saving of the variable reference level occurs only when the presence of the object is no longer detected.

36. The detection device as claimed in claim 1, wherein the resuming of the periodic saving of the variable reference level occurs only after the set period of time, even in the presence of the object.

* * * * *